US008309429B2

(12) United States Patent
Yamazaki

(10) Patent No.: US 8,309,429 B2
(45) Date of Patent: Nov. 13, 2012

(54) METHOD FOR MANUFACTURING SEMICONDUCTOR SUBSTRATE AND SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 98 days.

(21) Appl. No.: 12/211,933

(22) Filed: Sep. 17, 2008

(65) Prior Publication Data

US 2009/0081844 A1 Mar. 26, 2009

(30) Foreign Application Priority Data

Sep. 21, 2007 (JP) ................................ 2007-244624

(51) Int. Cl.
*H01L 21/26* (2006.01)
(52) U.S. Cl. .................. 438/455; 438/406; 257/E21.567
(58) Field of Classification Search .................. 438/406, 438/455; 257/E21.568, E21.567
See application file for complete search history.

(56) References Cited

U.S. PATENT DOCUMENTS

| | | |
|---|---|---|
| 5,374,564 A | 12/1994 | Bruel |
| 6,140,210 A | 10/2000 | Aga et al. |
| 6,146,979 A | 11/2000 | Henley et al. |
| 6,159,824 A | 12/2000 | Henley et al. |
| 6,287,941 B1 | 9/2001 | Kang et al. |
| 6,653,209 B1 | 11/2003 | Yamagata |
| 6,759,277 B1 | 7/2004 | Flores et al. |
| 6,818,529 B2 | 11/2004 | Bachrach et al. |
| 6,884,694 B2 | 4/2005 | Park et al. |
| 7,119,365 B2 | 10/2006 | Takafuji et al. |
| RE39,484 E | 2/2007 | Bruel |
| 7,253,040 B2 | 8/2007 | Itoga et al. |
| 7,354,844 B2 | 4/2008 | Endo et al. |
| 7,638,408 B2 | 12/2009 | Yamazaki et al. |
| 7,981,766 B2 | 7/2011 | Yamazaki et al. |

(Continued)

FOREIGN PATENT DOCUMENTS

JP 05-211128 8/1993

(Continued)

OTHER PUBLICATIONS

Sullivan et al., "P-220L: Late-News Poster: Layer-Transfer of Silicon Single-Crystal Films on Large-Area Glass Substrates for Mobile Display Applications," SID 06 Digest, Jun. 2006, pp. 280-282.

*Primary Examiner* — Hsien Ming Lee
*Assistant Examiner* — Michelle Fan
(74) *Attorney, Agent, or Firm* — Eric J. Robinson; Robinson Intellectual Property Law Office, P.C.

(57) ABSTRACT

A plurality of single crystal semiconductor substrates are arranged and then the plurality of single crystal semiconductor substrates which have been arranged are overlapped with a base substrate, so that the base substrate and the plurality of single crystal semiconductor substrates are bonded to each other. Then, each of the plurality of single crystal semiconductor substrates is separated to form a plurality of single crystal semiconductor layers over the base substrate. Next, in order to reduce crystal defects in the plurality of single crystal semiconductor layers, the plurality of single crystal semiconductor layers are irradiated with a laser beam. The plurality of single crystal semiconductor layers are thinned by being etched before or after irradiation with a laser beam.

40 Claims, 19 Drawing Sheets

U.S. PATENT DOCUMENTS

| | | | |
|---|---|---|---|
| 8,048,728 B2 | 11/2011 | Yamazaki | |
| 8,124,499 B2 * | 2/2012 | Henley et al. | 438/460 |
| 2002/0070454 A1 | 6/2002 | Yasukawa | |
| 2003/0183876 A1 | 10/2003 | Takafuji et al. | |
| 2004/0055999 A1 | 3/2004 | Chen et al. | |
| 2004/0238851 A1 | 12/2004 | Flores et al. | |
| 2005/0032283 A1 | 2/2005 | Itoga et al. | |
| 2005/0266659 A1 * | 12/2005 | Ghyselen et al. | 438/459 |
| 2005/0277296 A1 | 12/2005 | Adetutu et al. | |
| 2007/0034157 A1 | 2/2007 | Nakata et al. | |
| 2007/0063281 A1 | 3/2007 | Takafuji et al. | |
| 2007/0117354 A1 | 5/2007 | Gadkaree et al. | |
| 2007/0281172 A1 * | 12/2007 | Couillard et al. | 428/446 |
| 2008/0038908 A1 * | 2/2008 | Henley | 438/530 |
| 2008/0063840 A1 | 3/2008 | Morita et al. | |
| 2008/0160661 A1 * | 7/2008 | Henley | 438/68 |
| 2008/0237779 A1 | 10/2008 | Yamazaki et al. | |
| 2008/0237780 A1 | 10/2008 | Yamazaki et al. | |
| 2008/0254560 A1 | 10/2008 | Yamazaki | |
| 2009/0047771 A1 | 2/2009 | Yamazaki et al. | |
| 2009/0079024 A1 | 3/2009 | Yamazaki | |
| 2009/0079025 A1 | 3/2009 | Yamazaki | |
| 2009/0081845 A1 | 3/2009 | Yamazaki et al. | |

FOREIGN PATENT DOCUMENTS

| | | | |
|---|---|---|---|
| JP | 2003-257804 | | 9/2003 |
| JP | 2003332406 A | * | 11/2003 |
| WO | WO 2004/025360 | | 3/2004 |

* cited by examiner

METHOD FOR MANUFACTURING SEMICONDUCTOR SUBSTRATE AND SEMICONDUCTOR DEVICE

BACKGROUND OF THE INVENTION

1. Field of the Invention

The present invention relates to a method for manufacturing a semiconductor substrate having an SOI (silicon on insulator) structure. The present invention also relates to a method for manufacturing a semiconductor device using the semiconductor substrate. Note that a semiconductor device in this specification refers to any device which can function by utilizing semiconductor characteristics.

2. Description of the Related Art

In recent years, VLSI technology has been dramatically progressed, and an SOI structure by which speeding up and low power consumption are realized has attracted attention. This technology allows an active region (channel formation region) of a field-effect transistor (FET), which has been formed of bulk single crystal silicon, to be formed of a single crystal silicon thin film. It is known that a MOS field-effect transistor manufactured using an SOI structure has lower parasitic capacitance than that manufactured using a conventional bulk single crystal silicon substrate, which is an advantage in increasing speed.

Examples of SOI substrates include SIMOX substrates and bonded substrates. For example, an SOI structure of a SIMOX substrate is obtained as follows: oxygen ions are implanted into a single crystal silicon substrate and heat treatment is performed at 1300° C. or more to form a buried oxide (BOX) layer, so that a single crystal silicon thin film is formed on the surface. For a SIMOX substrate, oxygen ion implantation can be controlled precisely and thus a single crystal silicon thin film having an even thickness can be formed with high precision; however, there is a problem with costs because a long period of time is required for oxygen ion implantation. In addition, there is another problem in that a single crystal silicon thin film is likely to be damaged during oxygen ion implantation.

An SOI structure of a bonded substrate is obtained as follows: two single crystal silicon substrates (a base substrate and a bond substrate) are bonded to each other with an oxide film interposed therebetween and one of the two single crystal silicon substrates (the bond substrate) is thinned from the rear surface thereof (a surface opposite to the bonded surface), so that a single crystal silicon thin film is formed. As a thinning method, a technique utilizing hydrogen ion implantation, which is called Smart Cut (registered trademark), has been suggested because it is difficult to form an even and thin single crystal silicon thin film by grinding and polishing (for example, see Reference 1: Japanese Published Patent Application No. H5-211128).

SUMMARY OF THE INVENTION

However, a conventional SOI substrate depends on the size of a single crystal silicon wafer and thus has a difficulty in being increased in area. Therefore, an object of the present invention is to provide a semiconductor substrate which is obtained by bonding a plurality of single crystal semiconductor layers to a substrate larger than a single crystal silicon substrate. Another object of the present invention is to provide a method for manufacturing a semiconductor substrate, in which a plurality of single crystal semiconductor layers can be efficiently bonded to a large substrate.

In a first structure of the present invention, a plurality of single crystal semiconductor substrates are arranged and then the plurality of single crystal semiconductor substrates which have been arranged are overlapped with a base substrate, so that the base substrate and the plurality of single crystal semiconductor substrates are bonded to each other. Then, the plurality of single crystal semiconductor substrates is separated to form a plurality of single crystal semiconductor layers over the base substrate. Note that in the first structure of the present invention, a container (tray) for temporally holding the plurality of single crystal semiconductor substrates which are arranged is prepared and the bonding is performed while the plurality of single crystal semiconductor substrates are arranged in the tray. Next, in order to reduce crystal defects in the plurality of single crystal semiconductor layers, the plurality of single crystal semiconductor layers are irradiated with a laser beam. In the first structure of the present invention, the plurality of single crystal semiconductor layers are thinned by being etched before or after the irradiation with a laser beam.

In a second structure of the present invention, an insulating film is formed over a plurality of single crystal semiconductor substrates which have been arranged in a tray. Then, the plurality of single crystal semiconductor substrates which have been arranged in the tray are overlapped with a base substrate with the insulating film interposed therebetween, so that the base substrate and the plurality of single crystal semiconductor substrates are bonded to each other. Next, the plurality of single crystal semiconductor substrates is separated to form a plurality of single crystal semiconductor layers over the base substrate. Note that the tray used when the insulating film is formed and the tray used when the base substrate and the plurality of single crystal semiconductor substrates are bonded to each other are not necessarily the same. Different trays may be used in different steps. Next, in order to reduce crystal defects in the plurality of single crystal semiconductor layers, the plurality of single crystal semiconductor layers are irradiated with a laser beam. In the second structure of the present invention, the plurality of single crystal semiconductor layers are thinned by being etched before or after the irradiation with a laser beam.

In a third structure of the present invention, doping is performed on a plurality of single crystal semiconductor substrates which have been arranged in a tray, so that a damaged region is formed at a given depth of each of the plurality of single crystal semiconductor substrates. Then, the plurality of single crystal semiconductor substrates which have been arranged in the tray are overlapped with a base substrate, so that the base substrate and the plurality of single crystal semiconductor substrates are bonded to each other. Next, the plurality of single crystal semiconductor substrates is separated at each of the damaged regions to form a plurality of single crystal semiconductor layers over the base substrate. Note that the tray used when each of the damaged regions is formed and the tray used when the base substrate and the plurality of single crystal semiconductor substrates are bonded to each other are not necessarily the same. Different trays may be used in different steps. Next, in order to reduce crystal defects in the plurality of single crystal semiconductor layers, the plurality of single crystal semiconductor layers are irradiated with a laser beam. In the third structure of the present invention, the plurality of single crystal semiconductor layers are thinned by being etched before or after the irradiation with a laser beam.

It becomes possible to provide a semiconductor substrate having a larger area (a substrate provided with a semiconductor film) than a bulk single crystal semiconductor substrate such as Si wafer. Therefore, by using the semiconductor substrate of the present invention, productivity of semiconductor devices such as semiconductor integrated circuits can be increased.

DETAILED DESCRIPTION OF THE INVENTION

Figure 1:
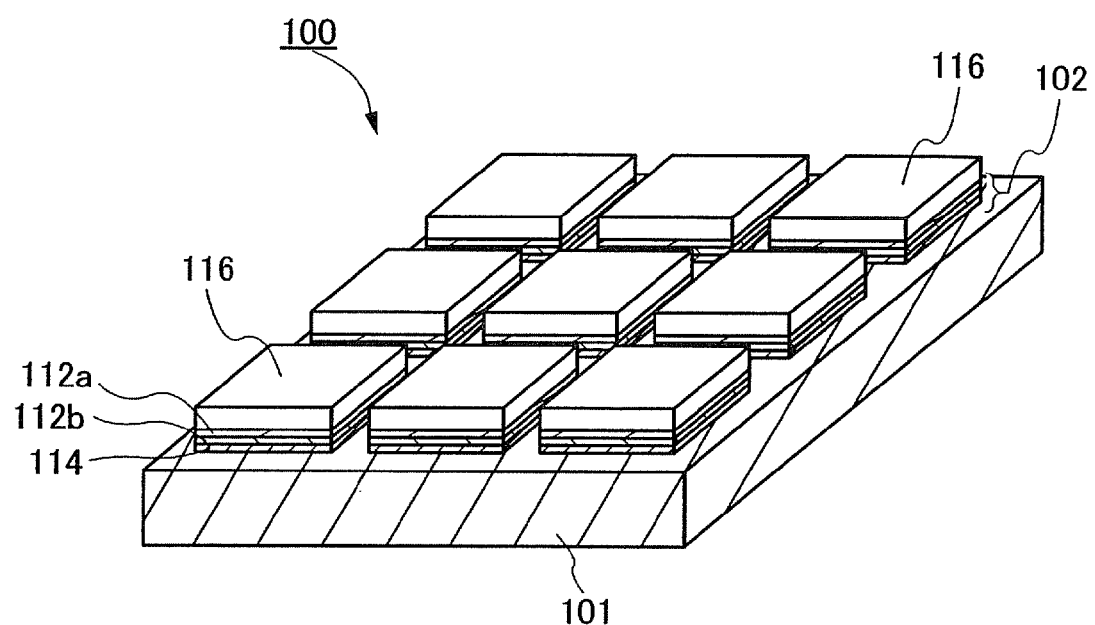
FIG. 1 is a perspective view of a semiconductor substrate.

Hereinafter, the present invention will be described. However, the present invention can be carried out in many different modes, and it will be easily understood by those skilled in the art that various changes and modifications can be made to the modes and details thereof without departing from the spirit and scope of the present invention. Therefore, the present invention should not be construed as being limited to the description in the following embodiment modes and embodiments. Note that like reference numerals refer to like parts throughout the drawings, and repetitive description concerning materials, shapes, manufacturing methods, and the like is omitted.

(Embodiment Mode 1)

This embodiment mode will describe a semiconductor substrate having an SOI structure in which a plurality of single crystal semiconductor layers are formed over a substrate and a method for manufacturing the semiconductor substrate.

FIG. 1 is a perspective view illustrating a structure example of a semiconductor substrate 100. The semiconductor substrate 100 is formed by bonding a plurality of single crystal semiconductor layers 116 to a base substrate 101. Each of the single crystal semiconductor layers 116 is provided over the base substrate 101 with an insulating layer 102 interposed therebetween. The semiconductor substrate 100 is a substrate having a so-called SOI structure.

The insulating layer 102 may have either a single-layer structure or a layered structure. In this embodiment mode, the insulating layer 102 has a three-layer structure: a bonding layer 114, an insulating film 112b which is a silicon nitride oxide layer, and an insulating film 112a which is a silicon oxynitride layer are stacked in this order over the base substrate 101.

The single crystal semiconductor layer 116 is formed by thinning a single crystal semiconductor substrate. As a single crystal semiconductor substrate, a commercially-available semiconductor substrate can be used; for example, a single crystal semiconductor substrate formed of a group 4 element, such as a single crystal silicon substrate, a single crystal germanium substrate, or a single crystal silicon germanium substrate, can be used. Alternatively, a compound semiconductor substrate formed of gallium arsenide, indium phosphide, or the like may be used.

As the base substrate 101, a substrate having an insulating surface can be used. Specifically, various glass substrates used in electronics industry, such as substrates of aluminosilicate glass, aluminoborosilicate glass, and barium borosilicate glass, a quartz substrate, a ceramic substrate, and a sapphire substrate are given. Preferably, a glass substrate is used as the base substrate 101. It is preferable to use a glass substrate having a coefficient of thermal expansion from $25 \times 10^{-7}$ to $50 \times 10^{-7}/°$ C., inclusive (preferably, from $30 \times 10^{-7}$ to $40 \times 10^{-7}/°$ C., inclusive) and a strain point from 580 to 680° C., inclusive (preferably, from 600 to 680° C., inclusive). Further, a non-alkali glass substrate is preferable as the glass substrate because it prevents a semiconductor device from being contaminated. As a material of the non-alkali glass substrate, a glass material such as aluminosilicate glass, aluminoborosilicate glass, or barium borosilicate glass is used, for example. Alternatively, as the base substrate 101, a conductive substrate formed of a conductor such as metal or stainless steel, a semiconductor substrate formed of a semiconductor such as silicon or gallium arsenide, or the like may be used instead of the above-described substrate having an insulating surface.

It is preferable to use a mother glass substrate developed for manufacturing a liquid crystal panel as a glass substrate. As such a mother glass substrate, substrates having the following sizes are known: the third generation (550 mm×650 mm), the 3.5-th generation (600 mm×720 mm), the fourth generation (680 mm×880 mm, or 730 mm×920 mm), the fifth generation (1100 mm×1300 mm), the sixth generation (1500 mm×1850 mm), the seventh generation (1870 mm×2200 mm), the eighth generation (2200 mm×2400 mm), and the like.

By using a large substrate such as a mother glass substrate as the base substrate 101, the SOI substrate can be increased in area. Increasing the SOI substrate in area allows many chips such as ICs or LSIs to be manufactured all at once, and thus the number of chips manufactured from one substrate is increased; therefore, productivity can be dramatically increased.

A method for manufacturing the semiconductor substrate 100 illustrated in FIG. 1 will be described below with reference to FIGS. 2 to 10B.

Figure 2:
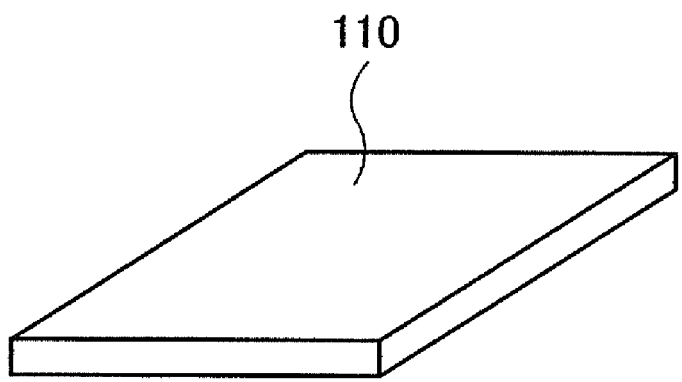
FIG. 2 is a perspective view of a single crystal semiconductor substrate.

First, a single crystal semiconductor substrate 110 is prepared. The single crystal semiconductor substrate 110 is processed to have a desired size and a desired shape. FIG. 2 is a perspective view illustrating an example of the structure of the single crystal semiconductor substrate 110. Considering that, for example, the single crystal semiconductor substrate 110 is bonded to the base substrate 101 having a rectangular shape and a region to be exposed to light of an exposure apparatus such as a reduced-projection light exposure apparatus is rectangular, the shape of the single crystal semiconductor substrate 110 is preferably rectangular as illustrated in FIG. 2. Note that a rectangle includes a square if not otherwise specified in this specification. For example, the single crystal semiconductor substrate 110 having a rectangular shape is processed so that the length of a long side thereof is n times (n is a given positive integer, n≧1) as long as that of one side of a region to be exposed to light of one shot from a reduced-projection light exposure apparatus.

The single crystal semiconductor substrate 110 having a rectangular shape can be formed by cutting a commercial circular bulk single crystal semiconductor substrate. The substrate can be cut with a cutting apparatus such as a dicer or a wire saw; laser cutting; plasma cutting; electron beam cutting; or any other cutting means. Alternatively, the single crystal semiconductor substrates 110 having a rectangular shape may be manufactured by processing an ingot for manufacturing a semiconductor substrate, which has not been thinned as a substrate yet, to be a rectangular solid so that a cross section of the ingot is rectangular and then thinning the rectangular solid ingot.

Figure 3:
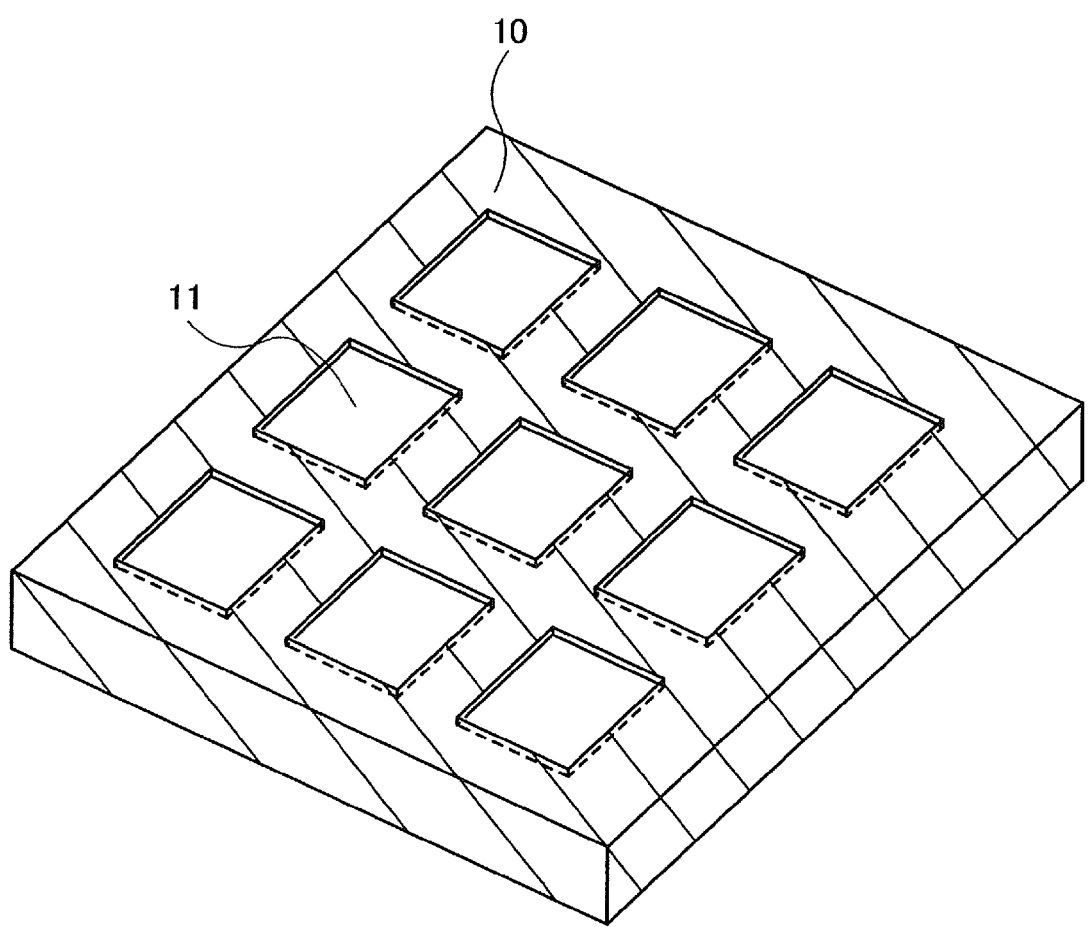
FIG. 3 is a perspective view of a tray.
Figure 4:
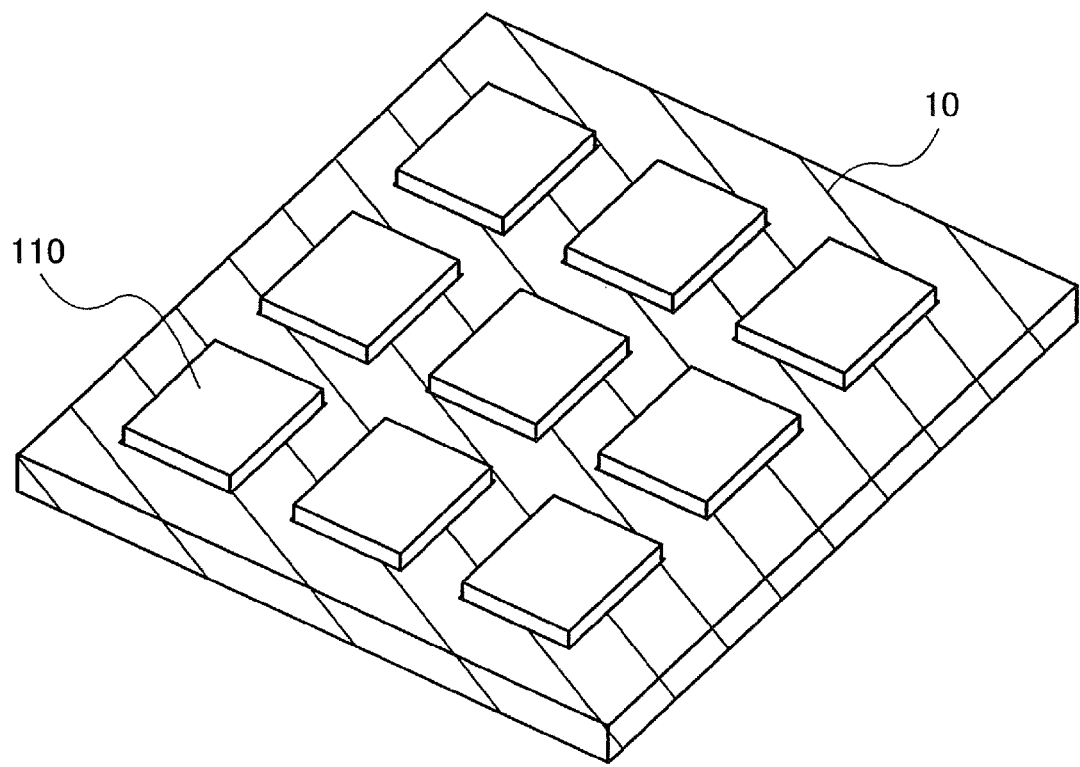
FIG. 4 is a view illustrating that single crystal semiconductor substrates are arranged in a tray.

After a plurality of the single crystal semiconductor substrates 110 are cleaned, the single crystal semiconductor substrates 110 are arranged in a tray 10. FIG. 3 is a perspective view illustrating an example of the structure of the tray 10. The tray 10 is a planar member in which a plurality of depressions 11 for holding the single crystal semiconductor substrates 110 are formed. FIG. 3 illustrates the tray for manufacturing the semiconductor substrate 100 in FIG. 1, in which three rows and three columns of depressions 11 are formed. As illustrated in FIG. 4, the single crystal semiconductor substrates 110 are arranged in the tray 10 so as to be located in the depressions 11.

The tray 10 is formed of a material which is not modified or transformed by heat treatment in the manufacturing process of the semiconductor substrate 100. In particular, it is preferable to select a material which is not easily expanded by heat treatment. The tray 10 can be formed of, for example, quartz glass, stainless steel, non-alkali glass, or the like.

The thickness of the tray 10 can be from 1.1 to 2 mm, inclusive. The depth of the depression 11 can be from 0.2 to 0.6 mm, inclusive, preferably from 0.3 to 0.5 mm, inclusive. The size of the tray 10 is preferably the same as that of the base substrate 101. The size of the depression 11 is large enough that the single crystal semiconductor substrate 110 is located within the depression 11. Note that in the manufacturing method of this embodiment mode, the sizes and the arrangement of the single crystal semiconductor layers 116 of the semiconductor substrate 100 are restricted by the sizes and the arrangement of the depressions 11 as illustrated in FIG. 4.

Figure 5A:
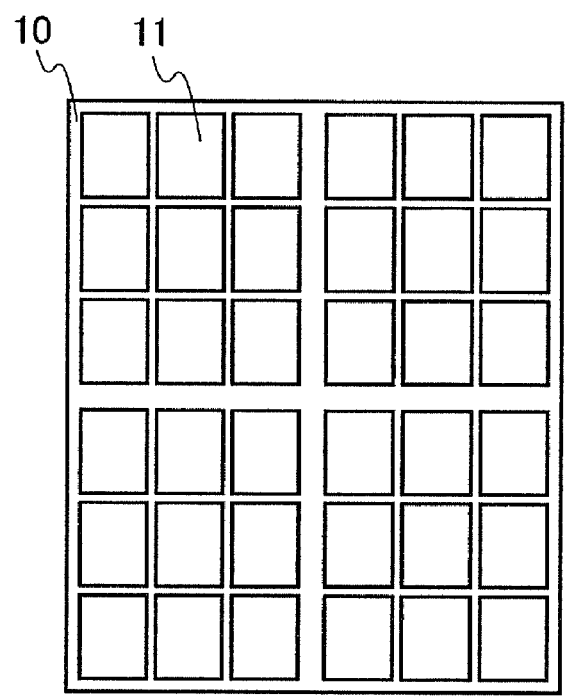
FIGS. 5A and 5B are top plan views of trays.
Figure 5B:
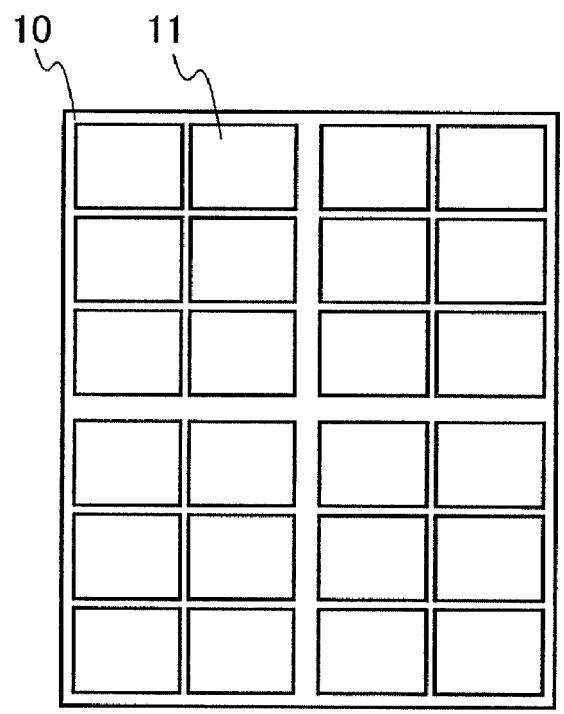
Figure 6A:
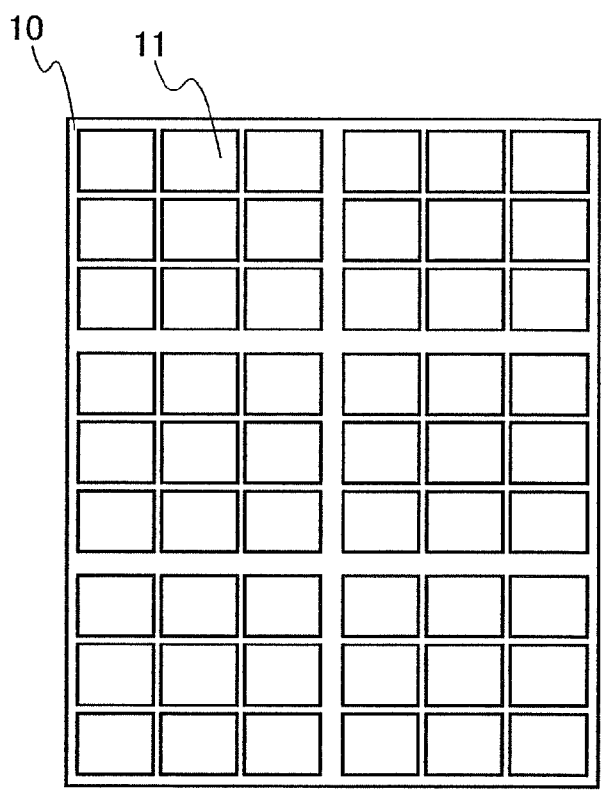
FIGS. 6A and 6B are top plan views of trays.
Figure 6B:
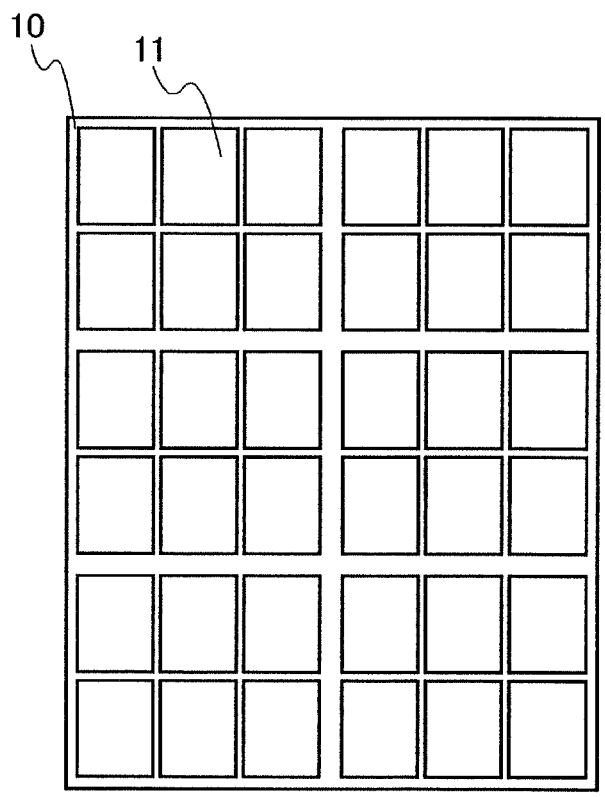

FIGS. 5A and 5B and FIGS. 6A and 6B are top plan views each illustrating a structure example of the tray 10. Each of FIGS. 5A and 5B is a top plan view of the tray 10 in the case of using a mother glass substrate with a size of 600 mm×720 mm as the base substrate 101, and the size of the tray 10 is 600 mm×720 mm. Each of FIGS. 6A and 6B is a top plan view of the tray 10 in the case of using a mother glass substrate of the fourth generation with the size of 730 mm×920 mm as the base substrate 101, and a size of the tray 10 is 730 mm×920 mm.

FIG. 5A is a plan view of the tray 10 formed considering the sizes and the arrangement of the depressions 11 such that the sizes and the arrangement of the depressions 11 correspond to a region to be exposed to light having four inches on each side of a reduced-projection light exposure apparatus. The tray 10 is partitioned into four blocks and the nine depressions 11, which are arranged in three rows and three columns, are formed in each block. The size of each of the depressions 11 is 102 mm×82 mm, which is within a region to be exposed to light of one shot. In each block, a width of a longitudinal space between the depressions 11 is 11 mm and a width of a lateral space between the depressions 11 is 11 mm, and a distance from the edge of the tray 10 to the edge of the depression 11 is 16 mm on each side.

FIG. 5B is a plan view of the tray 10 formed considering the sizes and the arrangement of the depressions 11 such that the sizes and the arrangement of the depressions 11 correspond to a region to be exposed to light having five inches on each side of a reduced-projection light exposure apparatus. The tray 10 is partitioned into four blocks and the six depressions 11, which are arranged in three rows and two columns, are formed in each block. The size of each of the depressions 11 is 102 mm×130 mm, which is within a region to be exposed to light of one shot. In each block, a width of a longitudinal space between the depressions 11 is 11 mm and a width of a lateral space between the depressions 11 is 10 mm, and a distance from the edge of the tray 10 to the edge of the depression 11 is 16 mm on each side.

FIG. 6A is a plan view of the tray 10 formed considering the sizes and the arrangement of the depressions 11 such that the sizes and the arrangement of the depressions 11 correspond to a region to be exposed to light having four inches on each side of a reduced-projection light exposure apparatus. The tray 10 is partitioned into six blocks and the nine depressions 11, which are arranged in three rows and three columns, are formed in each block. The size of each of the depressions 11 is 105 mm×84 mm, which is within a region to be exposed to light of one shot. In each block, a width of a longitudinal space between the depressions 11 is 11 mm and a width of a lateral space between the depressions 11 is 10 mm, and a longitudinal distance from the edge of the tray 10 to the edge of the depression 11 is 16 mm and a lateral distance from the edge of the tray 10 to the edge of the depression 11 is 15 mm.

FIG. 6B is a plan view of the tray 10 formed considering the sizes and the arrangement of the depressions 11 such that the sizes and the arrangement of the depressions 11 correspond to a region to be exposed to light having five inches on each side of a reduced-projection light exposure apparatus. The tray 10 is partitioned into six blocks and the six depressions 11, which are arranged in two rows and three columns, are formed in each block. The size of each of the depressions 11 is 132 mm×105 mm, which is within a region to be exposed to light of one shot. In each block, a width of a longitudinal space between the depressions 11 is 13 mm and a width of a lateral space between the depressions 11 is 10 mm, and a distance from the edge of the tray 10 to the edge of the depression 11 is 15 mm on each side.

Figure 7A:
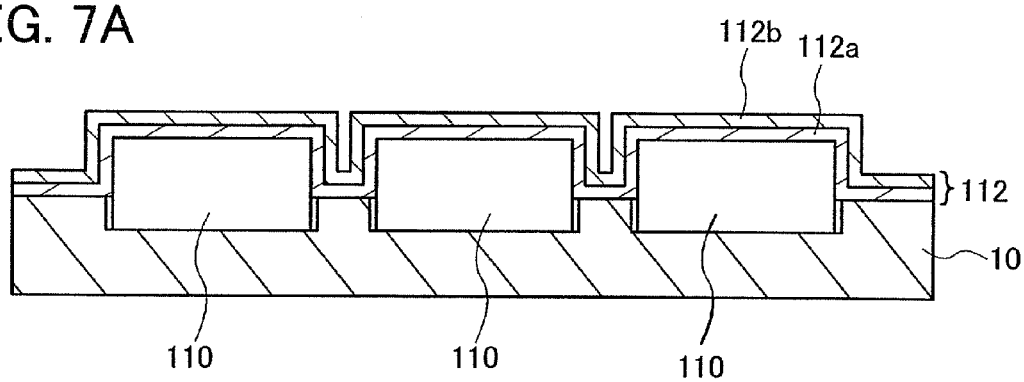
FIGS. 7A to 7D are views illustrating a method for manufacturing a semiconductor substrate.

After the single crystal semiconductor substrates 110 are provided in the tray 10 as illustrated in FIG. 4, an insulating layer 112 is formed over the single crystal semiconductor substrates 110 as illustrated in FIG. 7A. The insulating layer 112 can be formed to have a single-layer structure or a multilayer structure including two or more layers and the thickness thereof can be from 5 to 400 nm, inclusive. The insulating layer 112 can be formed of an insulating film containing silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film. Alternatively, an insulating film formed of an oxide of metal such as aluminum oxide, tantalum oxide, or hafnium oxide; an insulating film formed of a nitride of metal such as aluminum nitride; an insulating film formed of an oxynitride of metal such as an aluminum oxynitride film; or an insulating film formed of nitride oxide of metal such as an aluminum nitride oxide film may be used.

Note that in this specification, an oxynitride refers to a substance that contains more oxygen atoms than nitrogen atoms and nitride oxide refers to a substance that contains more nitrogen atoms than oxygen atoms. For example, in the case where measurements are performed using Rutherford backscattering spectrometry (RBS) and hydrogen forward scattering (HFS), silicon oxynitride refers to a substance containing oxygen, nitrogen, silicon, and hydrogen at concentrations ranging from 50 to 70 at. %, from 0.5 to 15 at. %, from 25 to 35 at. %, and from 0.1 to 10 at. %, respectively. Further, silicon nitride oxide refers to a substance containing oxygen, nitrogen, silicon, and hydrogen at concentrations ranging from 5 to 30 at. %, from 20 to 55 at. %, from 25 to 35 at. %, and from 10 to 30 at. %, respectively. It is to be noted that assuming that the total percentage of atoms contained in silicon oxynitride or silicon nitride oxide is 100 at. %, percentages of nitrogen, oxygen, silicon, and hydrogen are within the ranges given above.

Such an insulating film forming the insulating layer 112 can be formed by a method such as a CVD method, a sputtering method, or oxidation or nitridation of the single crystal semiconductor substrates 110.

In the case of using a substrate containing an impurity which could reduce reliability of a semiconductor device, such as alkali metal or alkaline earth metal, as the base substrate 101, it is preferable that the insulating layer 112 be provided with at least one layer of a film which can prevent such an impurity from diffusing into a semiconductor layer of an SOI substrate from the base substrate 101. As such a film, a silicon nitride film, a silicon nitride oxide film, an aluminum nitride film, an aluminum nitride oxide film, or the like can be used. The film is included in the insulating layer 112 so that the insulating layer 112 can function as a barrier layer.

For example, in the case where the insulating layer 112 is formed as a barrier layer having a single-layer structure, it can be formed with a silicon nitride film, a silicon nitride oxide film, an aluminum nitride film, or an aluminum nitride oxide film with a thickness from 5 to 200 nm, inclusive.

In the case where the insulating layer 112 is a film having a two-layer structure, which functions as a barrier layer, an upper layer is formed of an insulating film having an excellent barrier function. The upper layer can be formed of a silicon nitride film, a silicon nitride oxide film, an aluminum nitride film, or an aluminum nitride oxide film with a thickness from 5 to 200 nm, inclusive. Each of these films provides a high blocking effect to prevent diffusion of the impurity, but have high internal stress. Therefore, it is preferable that a film which provides an effect of alleviating stress of the insulating film as the upper layer be selected as an insulating film as a lower layer, which is in contact with the single crystal semiconductor substrates 110. As the insulating film as a lower layer, a silicon oxide film, a silicon oxynitride film, a thermally-oxidized film obtained by thermally oxidizing the single crystal semiconductor substrates 110, or the like is used. The thickness of the insulating film as the lower layer can be from 5 to 300 nm, inclusive.

In this embodiment mode, the insulating layer 112 has a two-layer structure of the insulating film 112a and the insulating film 112b. As examples of a combination of the insulating film 112a and the insulating film 112b, which have the insulating layer 112 function as a blocking film, combinations of a silicon oxide film and a silicon nitride film, a silicon oxynitride film and a silicon nitride film, a silicon oxide film and a silicon nitride oxide film, and a silicon oxynitride film and a silicon nitride oxide film are given.

For example, the insulating film 112a as the lower layer can be formed of a silicon oxynitride film by a plasma enhanced CVD method (hereinafter referred to as a "PECVD method") using $SiH_4$ and $N_2O$ for a process gas. Alternatively, as the insulating film 112a, a silicon oxide film may be formed by a PECVD method using an organosilane gas and oxygen for a process gas. Alternatively, the insulating film 112a may be formed of an oxide film obtained by oxidizing the single crystal semiconductor substrates 110.

As organosilane, for example, the following compounds are given: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The insulating film 112b as the upper layer can be formed of a silicon nitride oxide film by a PECVD method using $SiH_4$, $N_2O$, $NH_3$, and $H_2$ for a process gas. Alternatively, the insulating film 112b as the upper layer may be formed of a silicon nitride film by a PECVD method using $SiH_4$, $N_2$, $NH_3$, and $H_2$ for a process gas.

For example, in the case of forming the insulating film 112a using silicon oxynitride and the insulating film 112b using silicon nitride oxide by a PECVD method, the plurality of single crystal semiconductor substrates 110 arranged in the tray 10 is carried in a treatment chamber of a PECVD apparatus and plasma of gasses of $SiH_4$ and $N_2O$ is generated, so that a silicon oxynitride film is formed over the single crystal semiconductor substrates 110. After that, gasses introduced into the treatment chamber are changed to $SiH_4$, $N_2O$, $NH_3$ and $H_2$, and plasma of a mixed gas of them is generated, so that a silicon nitride oxide film is formed successively over the silicon oxynitride film. In the case of using a PECVD apparatus having a plurality of treatment chambers, a silicon nitride oxide film and a silicon oxynitride film may be formed in different treatment chambers. It is needless to say that by changing gasses introduced into a treatment chamber, a silicon oxide film may be formed for a lower layer and a silicon nitride film may be formed for an upper layer.

By thus forming the insulating film 112a and the insulating film 112b, the insulating film 112 can be formed over each of the plurality of single crystal semiconductor substrates 110 with high throughput. Further, since the insulating film 112a and the insulating film 112b can be formed without being exposed to the air, the interface between the insulating film 112a and the insulating film 112b can be prevented from being contaminated by the air.

The insulating film 112a can be formed of an oxide film obtained by performing oxidation treatment on the single crystal semiconductor substrates 110. For thermal oxidation treatment for forming the oxide film, dry oxidation may be performed and in that case, it is preferable to add a gas containing halogen in an oxidation atmosphere. As a gas containing halogen, one kind or a plurality of kinds of gasses selected from HCl, HF, $NF_3$, HBr, Cl, ClF, $BCl_3$, F, and $Br_2$ can be used.

For example, heat treatment is performed at temperatures of 700° C. or more in an atmosphere containing HCl at 0.5 to 10 volume % (preferably 3 volume %) with respect to oxygen. It is preferable that thermal oxidation be performed at heating temperatures from 950 to 1100° C., inclusive. Treatment time may be from 0.1 to 6 hours, preferably from 0.5 to 1 hour. The thickness of the oxide film thus formed can be from 10 to 1000 nm (preferably, from 50 to 200 nm), for example, 100 nm.

By performing oxidation treatment within such a temperature range, a gettering effect due to a halogen element can be obtained. Gettering particularly has an effect of removing a metal impurity. That is, with action of chlorine, an impurity such as metal turns into a volatile chloride and is released into a gas phase, thereby being removed from the single crystal semiconductor substrate 110. Further, a defect of a surface of the single crystal semiconductor substrate 110 is terminated by the halogen element contained in the oxidation atmosphere; therefore, the localized-level density at the interface between the oxide film and the single crystal semiconductor substrate 110 can be reduced.

By thermal oxidation treatment in the atmosphere containing halogen, halogen can be contained in the oxide film. The halogen element is contained at a concentration of from $1 \times 10^{17}$ to $5 \times 10^{20}$ atoms/$cm^3$, so that the oxide film can function as a protective film which captures an impurity such as metal to prevent contamination of the single crystal semiconductor layer 116.

In the case where the insulating film 112a as the lower layer is formed by thermal oxidation treatment and the insulating film 112b as the upper layer is formed by a gas phase method such as a PECVD method, it is possible that before the single crystal semiconductor substrates 110 are arranged in the tray 10, the insulating film 112a is formed by thermal oxidation treatment, and the single crystal semiconductor substrates 110 each provided with the insulating film 112a formed of an oxide film are arranged in the tray 10 and thereafter, the insulating film 112b is formed.

Figure 7B:
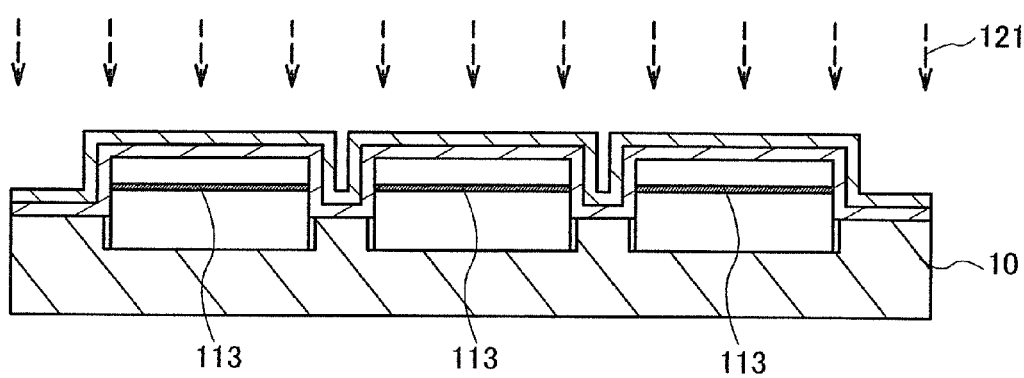

Next, as shown in FIG. 7B, an ion beam 121 including ions accelerated by an electric field is delivered to the single crystal semiconductor substrate 110 through the insulating layer 112, thereby forming a damaged region 113 in the single crystal semiconductor substrate 110 at a given depth from the surface thereof. Note that in the present invention, the damaged region refers to a region which is embrittled such that minute voids are formed therein, by irradiation of a single crystal semiconductor substrate with ions and impact of the ions or an atom or a molecule generated from the ions to the semiconductor. The depth at which the damaged region 113 is formed can be adjusted by the acceleration energy of the ion beam 121 and the angle at which the ion beam 121 enters. The acceleration energy can be adjusted by an acceleration voltage, dosage, or the like. The damaged region 113 is formed at a depth almost equal to the average depth to which the ions enter. The thickness of the semiconductor layer separated from each of the single crystal semiconductor substrates 110 can be determined by the depth to which the hydrogen ions are added. A depth at which the damaged region 113 is formed is from 50 to 500 nm, inclusive, preferably from 50 to 200 nm, inclusive.

When ions are added to the single crystal semiconductor substrates 110, an ion doping method in which mass separation is not performed is preferred to an ion implantation method in which mass separation is performed. This is because an ion doping method makes it possible to reduce the tact time in which damaged regions 113 are formed in the plurality of single crystal semiconductor substrates 110 provided in the tray 10 having a large area.

The single crystal semiconductor substrates 110 placed in the tray 10 are carried in a treatment chamber of an ion doping apparatus. A process gas is excited to generate plasma and a desired ion is extracted from the plasma and accelerated to generate an ion beam 121, and the ion beam 121 is delivered to the plurality of single crystal semiconductor substrates 110 so that ions are introduced at high concentration to a given depth and the damaged region 113 is formed.

When hydrogen ($H_2$) is used for a source gas, $H^+$, $H_2^+$, and $H_3^+$ can be produced by exciting a hydrogen gas. Proportions of ion species produced from a source gas can be changed by controlling an excitation method of plasma, a pressure of an atmosphere for producing plasma, an amount of supply of the source gas, or the like. In the case where the ion irradiation is performed by an ion doping method, it is preferable that $H_3^+$ be contained at 70% or more with respect to the total amount of $H^+$, $H_2^+$, and $H_3^+$ in the ion beam 121, and it is more preferable that a proportion of $H3^+$ be 80% or more. When $H_3^+$ occupies 70% or more, the proportion of $H_2^+$ ions in the ion beam 121 gets smaller relatively, which results in smaller variation in the average depth at which the hydrogen ions in the ion beam 121 enter. Consequently, the ion addition efficiency is improved and the tact time can be shortened.

$H_3^+$ has larger mass than $H^+$ and $H_2^+$. Therefore, as for the ion beam 121, in the case where the proportion of $H_3^+$ is larger than that of each of $H^+$ and $H_2^+$, hydrogen can be added in a shallower region of each of the single crystal semiconductor substrates 110 as compared to the case where the proportion of each of $H^+$ and $H_2^+$ is larger than that of $H_3^+$, even if acceleration voltages in irradiation are the same in both cases. Further, in the case where the proportion of $H_3^+$ is larger than that of each of $H^+$ and $H_2^+$, concentration distribution of hydrogen added to the single crystal semiconductor substrates 110 is sharp in a direction of thickness and thus the thickness of the damaged region 113 can also be reduced.

In the case where the ion irradiation is performed by an ion doping method using a hydrogen gas, an acceleration voltage can be set to from 10 to 200 kV, inclusive and a dosage can be set to from $1 \times 10^{16}$ to $6 \times 10^{16}$ ions/$cm^2$, inclusive. By irradiation with the hydrogen ions under this condition, the damaged region 113 can be formed in a region at a depth from 50 nm to 500 nm, inclusive in the single crystal semiconductor substrate 110, which could vary depending on the ion species included in the ion beam 121 and the proportion thereof.

For example, in the case where the single crystal semiconductor substrate 110 is a single crystal silicon substrate, the insulating film 112a is a 50 nm-thick silicon oxynitride film, and the insulating film 112b is a 50 nm-thick silicon nitride oxide film, a single crystal semiconductor layer with a thickness of approximately 120 nm can be separated from the single crystal semiconductor substrate 110 in the following condition: a source gas is hydrogen, the acceleration voltage is 40 kV, and the dosage is $2.2 \times 10^{16}$ ions/$cm^2$. Alternatively, when the irradiation with the hydrogen ions is performed under the aforementioned condition except that the insulating film 112a is a 100 nm-thick silicon oxynitride film, the semiconductor layer with a thickness of approximately 70 nm can be separated from the single crystal semiconductor substrate 110.

Helium (He) can alternatively be used as a source gas of the ion beam 121. Since most of the ion species produced by exciting helium are He+, the single crystal semiconductor substrate 110 can be irradiated mainly with He+ even in an ion doping method in which mass separation is not performed. Accordingly, a microvoid can be formed efficiently in the damaged region 113 by an ion doping method. In the case where the ion irradiation is performed by an ion doping method using helium, an acceleration voltage can be set to from 10 to 200 kV, inclusive and a dosage can be set to from $1\times10^{16}$ to $6\times10^{16}$ ions/cm$^2$, inclusive.

A halogen gas such as a chlorine gas (Cl$_2$ gas) or a fluorine gas (F$_2$ gas) may be used as the source gas.

Note that in an ion doping method, ions are introduced into a semiconductor by being accelerated by an electric field without mass separation performed; therefore, an impurity such as metal or a compound in an apparatus for ion irradiation may be introduced together with the ions. Therefore, in the case where ion irradiation is performed on the single crystal semiconductor substrate 110 by an ion doping method, the impurity may exist in the insulating film 112b which is an outmost surface. In that case, a surface of the insulating film 112b may be etched to remove the impurity.

Figure 7C:
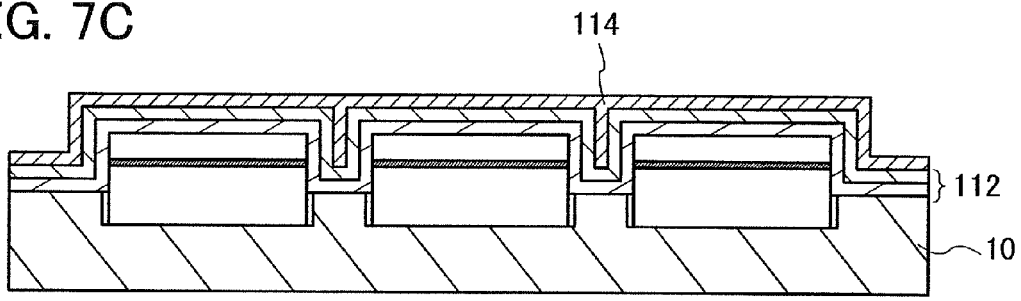

After the formation of the damaged region 113, the bonding layer 114 is formed on a top surface of the insulating layer 112 as shown in FIG. 7C. In the step of forming the bonding layer 114, the heating temperature of the single-crystal semiconductor substrate 110 is set at a temperature at which an element or molecule added to the damaged region 113 is not separated out, and the heating temperature is preferably 350° C. or less. In other words, the damaged region 113 does not release a gas within this heating temperature range. It is to be noted that the bonding layer 114 can be formed before the ion addition step. In that case, a process temperature at the time of forming the bonding layer 114 can be set at 350° C. or more.

The bonding layer 114 is a layer for forming a smooth and hydrophilic bonding plane on a surface of the single crystal semiconductor substrate 110. Therefore, the bonding layer 114 preferably has an average surface roughness Ra of 0.7 nm or less, more preferably 0.4 nm or less. The thickness of the bonding layer 114 can be from 10 to 200 nm, inclusive. The thickness of the bonding layer 114 is preferably from 5 to 500 nm, inclusive, and more preferably from 10 to 200 nm, inclusive.

The bonding layer 114 is preferably an insulating film formed by a chemical vapor reaction, and a silicon oxide film is preferred. In the case of forming a silicon oxide film by a plasma excitation CVD method as the bonding layer 114, it is preferable to use an organosilane gas and an oxygen (O$_2$) gas for a source gas. By using organosilane for the source gas, it is possible to form a silicon oxide film having a smooth surface at a process temperature of 350° C. or less. Alternatively, a low temperature oxide (LTO) formed at a temperature from 200 to 500° C., inclusive by a thermal CVD method can be used. LTO can be formed by using monosilane (SiH$_4$), disilane (Si$_2$H$_6$), or the like for a silicon source gas and using dinitrogen monoxide (N$_2$O) or the like for an oxygen source gas.

For an example of the condition for forming the bonding layer 114 formed of a silicon oxide film by using TEOS and O$_2$ for a source gas, into a treatment chamber, TEOS is introduced at a flow rate of 15 sccm and O$_2$ is introduced at a flow rate of 750 sccm. As a deposition pressure, a deposition temperature, an RF output, and power frequency, 100 Pa, 300° C., 300 W, and 13.56 MHz are respectively given, for example.

Note that a bonding layer formed at a relatively low temperature, such as a silicon oxide film formed with organosilane or a silicon nitride oxide film formed at a low temperature, includes a lot of OH groups on a surface thereof. Hydrogen bonding between the OH group and a water molecule forms a silanol group and bonds the base substrate and the bonding layer at a low temperature. Finally, a siloxane bond which is a covalent bond is formed between the base substrate and the bonding layer. Therefore, it can be said that the aforementioned bonding layer formed at a relatively low temperature, such as a silicon oxide film formed with organosilane or a silicon nitride oxide film formed at a low temperature, is more suitable for bonding at a low temperature than a thermally-oxidized film in which no OH group or an significantly few OH groups are inherent, which is used in Smart Cut (registered trademark) or the like.

Figure 7D:
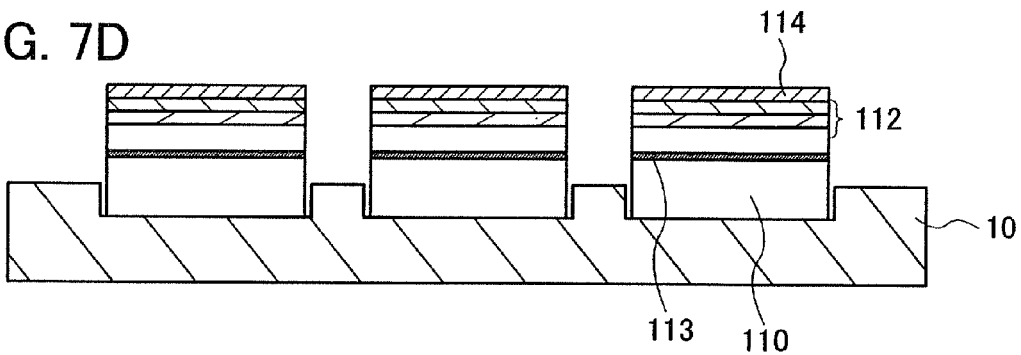

Next, the single crystal semiconductor substrates 110 each provided with the insulating layer 112 and the bonding layer 114 are separated from the tray 10 and cleaned. For this cleaning step, ultrasonic cleaning in pure water can be performed. The ultrasonic cleaning is preferably megahertz ultrasonic cleaning (megasonic cleaning). After ultrasonic cleaning, the single crystal semiconductor substrates 110 may be cleaned with ozone water. By cleaning with ozone water, organic substances can be removed and surface activation treatment for making the surface of the bonding layer 114 more hydrophilic can be performed. After the cleaning treatment and the surface activation treatment, the single crystal semiconductor substrates 110 are provided in the depressions 11 of the tray 10 as shown in FIG. 7D.

As the activation treatment on the surface of the bonding layer 114, cleaning with ozone water, irradiation treatment with an atomic beam or an ion beam, plasma treatment, or radical treatment can be performed. When an atomic beam or an ion beam is used, a neutral atomic beam of an inert gas such as argon or an ion beam of an inert gas such as argon can be used. These treatments may be performed with the single crystal semiconductor substrates 110 provided in the tray 10.

Then, the base substrate 101 and the single crystal semiconductor substrates 110 provided in the tray 10 are bonded to each other. Before the bonding, the base substrate 101 is also cleaned. As the cleaning, cleaning with hydrochloric acid and a hydrogen peroxide solution or megahertz ultrasonic cleaning can be performed. Further, it is preferable to perform surface activation treatment on a surface of the base substrate 101, which serves as a bonding surface, by similar treatment to that performed on the bonding layer 114.

In the case of using, as the base substrate 101, a glass substrate which significantly shrinks by being subjected to heat treatment, such as EAGLE2000 (manufactured by Corning, Inc.), a defect of bonding may occur after a bonding step. Therefore, in order to prevent such a defect of bonding due to shrinkage, heat treatment may be performed on the base substrate 101 before the bonding step described below.

Figure 8A:
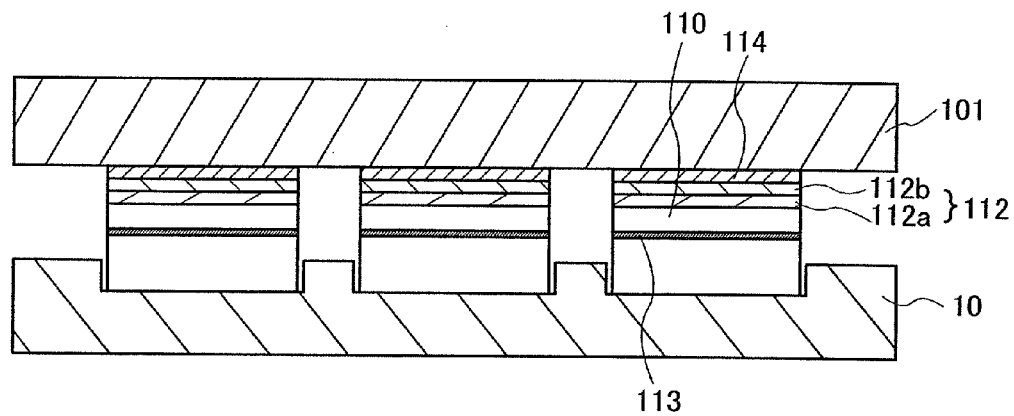
FIGS. 8A to 8C are views illustrating a method for manufacturing a semiconductor substrate.

FIG. 8A is a cross-sectional view illustrating the bonding step. The base substrate 101 is placed from an upper side of the tray 10 provided with the plurality of single crystal semiconductor substrates 110. A pressure of approximately 300 to 15000 N/cm$^2$ is applied to a part of an end of the base substrate 101. A pressure applied thereto is preferably from 1000 to 5000 N/cm$^2$. The bonding layer 114 and the base substrate 101 start to be gradually bonded together from the portion to which a pressure is applied. Then, all the single crystal semiconductor substrates 100 in the tray 10 are bonded to a piece of the base substrate 101. Since the bonding step does not need heat treatment and proceeds at a room temperature, a substrate with low heat resistance, such as a glass substrate, can be used as the base substrate 101.

Since the plurality of single crystal semiconductor substrates 110 are arranged in the tray 10, there may be the single crystal semiconductor substrate 110 of which a surface of the bonding layer 114 is not contact with the base substrate 101 because of difference in thicknesses of the single crystal semiconductor substrates 110. Therefore, pressure is preferably applied not to one part but to each of the single crystal semiconductor substrates 110. Further, even when heights of surfaces of the bonding layers 114 differ slightly while the single crystal semiconductor substrates 110 are provided in the tray 10, if a part of the bonding layer 114 is firmly attached to the base substrate 101 by deflection of the base substrate 101, entire surfaces of the bonding layers 114 can be bonded to the base substrate 101.

Figure 9:
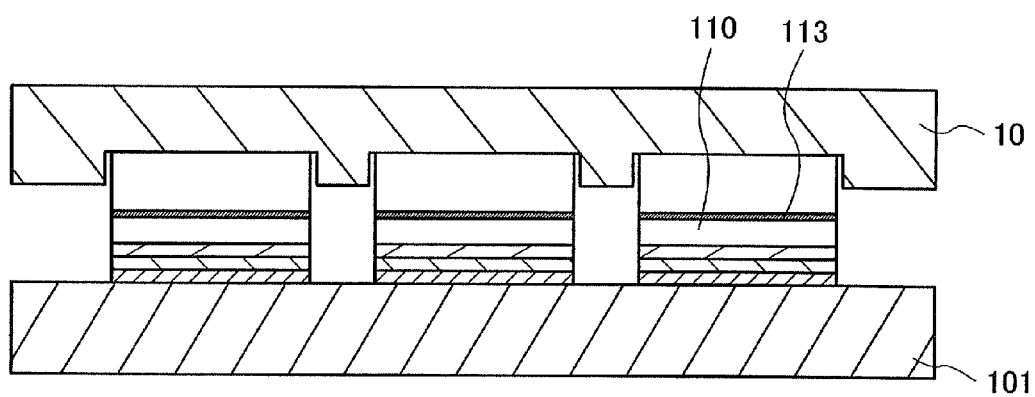
FIG. 9 is a view illustrating a method for manufacturing a semiconductor substrate.

Further, after the base substrate 101 is mounted on the tray 10 as shown in FIG. 8A, the tray 10 provided with the base substrate 101 is turned upside down as shown in FIG. 9; thus, difference of thicknesses of the single crystal semiconductor substrates 110 is balanced out and entire surfaces of the bonding layers 114 can be easily in contact with a surface of the base substrate 101.

After the single crystal semiconductor substrates 110 are bonded to the base substrate 101, it is preferable to perform heat treatment for increasing bonding force at the bonding interface between the base substrate 101 and the bonding layer 114. A process temperature is set so that the damaged region 113 is not cracked and can be in the range of from 200 to 450° C. Further, the single crystal semiconductor substrates 110 are bonded to the base substrate 101 while being heated within the temperature range, so that bonding force at the bonding interface between the base substrate 101 and the bonding layer 114 can be made strong.

As shown in FIG. 8A, if a bonding surface is contaminated by a dust or the like when the base substrate 101 is mounted on the single crystal semiconductor substrates 110 provided in the tray 10, the contaminated portion is not bonded. Therefore, in order to prevent the bonding surface from being contaminated, it is preferable to mount the base substrate 101 in an airtight treatment chamber. In addition, it is preferable to reduce a pressure in the treatment chamber to approximately $5.0 \times 10^{-3}$ Pa and make a clean atmosphere for the bonding treatment.

Figure 8B:
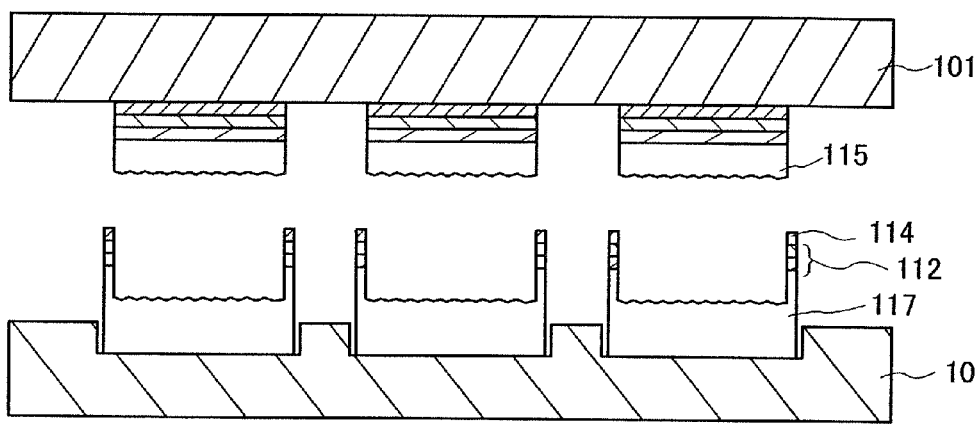

Then, heat treatment is performed to cause separation at the damaged regions 113 so that single crystal semiconductor layers 115 are separated from the single crystal semiconductor substrates 110. FIG. 8B is a view illustrating a separation step for separating the single crystal semiconductor layers 115 from the single crystal semiconductor substrates 110. A single crystal semiconductor substrate 117 is the single crystal semiconductor substrate 110 from which the single crystal semiconductor layer 115 is separated.

Note that as shown in FIG. 8B, a peripheral portion of the single crystal substrate 110 is not bonded to the base substrate 101 in many cases. This is because the peripheral portion of the single crystal semiconductor substrate 110 is chamfered or has a curvature, so that the base substrate 101 and the bonding layer 104 are not bonded together and the damaged region 113 is not easily separated at the peripheral portion of the single crystal semiconductor substrate 110. As another reason, it can also be given that polishing such as CMP, which is performed when the single crystal semiconductor substrates 110 are formed, is insufficient at the peripheral portion of the single crystal semiconductor substrate 110 and thus a surface of the peripheral portion is more uneven than that of the central portion. Further, in the case where the peripheral portions of the single crystal semiconductor substrates 110 are damaged by a carrier or the like when the single crystal semiconductor substrate 110 are arranged in the tray 10, the damage may be a cause why the peripheral portion is not easily bonded to the base substrate 101. Therefore, the single crystal semiconductor layer 115 which is smaller in size than the single crystal semiconductor substrate 110 is bonded to the base substrate 101, and an end portion of the single crystal semiconductor substrate 117 is provided with a projection and the insulating film 112b, the insulating film 112a, and the bonding layer 114, which are not bonded to the base substrate 101, are left remaining over the projection.

As the temperature rises due to heat treatment, the elements added in the ion irradiation step are separated out in the microvoids formed in the damaged region 113, thereby internal pressure increases. Due to the increase in pressure, the microvoids of the damaged region 113 change in volume and thus the damaged region 113 is cracked. As a result, the single crystal semiconductor substrate 110 is separated along the damaged region 113. Since the bonding layer 114 is bonded to the base substrate 101, the single crystal semiconductor layer 115 separated from the single crystal semiconductor substrate 110 is fixed onto the base substrate 101. The temperature for the heat treatment for separating the single crystal semiconductor layer 115 from the single crystal semiconductor substrate 110 is set so as not to exceed the strain point of the base substrate 101.

For the heating treatment, an RTA (rapid thermal anneal) apparatus, a resistance heating furnace, or a microwave heating apparatus can be used. As an RTA apparatus, a GRTA (gas rapid thermal anneal) apparatus or an LRTA (lamp rapid thermal anneal) apparatus can be used.

In the case of using a GRTA apparatus, a heating temperature and treatment time can be from 550 to 650° C., inclusive and from 0.5 to 60 minutes, inclusive, respectively. In the case of using a resistance heating furnace, a heating temperature and treatment time can be from 200 to 650° C., inclusive and from 2 to 4 hours, inclusive, respectively. In the case of using a microwave heating apparatus, a microwave frequency and treatment time can be 2.45 GHz and from 10 to 20 minutes, inclusive, respectively.

A specific treatment method for heating treatment using a vertical furnace with resistive heating will be described. The base substrate 101 to which the single crystal semiconductor substrates 110 provided in the tray 10 are bonded is put on a boat of the vertical furnace. The boat is carried in a chamber of the vertical furnace. In order to prevent oxidation of the single crystal semiconductor substrate 110, first, the chamber is evacuated. A vacuum is approximately $5 \times 10^{-3}$ Pa. After being evacuated, the chamber is supplied with nitrogen so as to be in a nitrogen atmosphere under atmospheric pressure. Meanwhile, a heating temperature is raised to 200° C.

After the chamber is set in a nitrogen atmosphere under atmospheric pressure, heating is performed at 200° C. for two hours. Then, the temperature is raised to 400° C. taking an hour. When the state at a heating temperature of 400° C. is stabilized, the heating temperature is raised to 600° C. taking an hour. When the state at a heating temperature of 600° C. is stabilized, heating treatment is performed at 600° C. for two hours. After that, the heating temperature is reduced to 400° C. taking an hour and 10 to 30 minutes later, the boat is taken out from the chamber. The single crystal semiconductor substrates 117 arranged in the tray 10 on the boat and the base substrate 101 to which the single crystal semiconductor layers 115 are bonded are cooled in an air atmosphere.

As for the heat treatment using a resistance heating furnace, heat treatment for increasing bonding force between the bonding layer 114 and the base substrate 101 and heat treatment for separation at the damaged region 113 are successively performed. In the case of performing the two heat treatment in different apparatuses, for example, heat treatment is performed at 200° C. for two hours in a resistance heating furnace and then the base substrate 101 and the single crystal semiconductor substrate 110 which are bonded to each other are taken out from the furnace. Next, heat treatment is performed at a process temperature from 600 to 700° C., inclusive for 1 to 30 minutes, inclusive in an RTA apparatus, so that the single crystal semiconductor substrate 110 is separated at the damaged region 113.

Figure 8C:
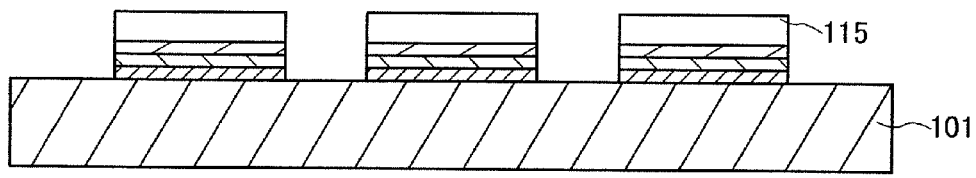

Next, in the present invention, as illustrated in FIG. 8C, the single crystal semiconductor layers 115 are etched so that the surfaces thereof roughened due to division at the damaged regions 113 are planarized. In this embodiment mode, a dry etching method such as a reactive ion etching (RIE) method, an ICP (inductively coupled plasma) etching method, an ECR (electron cyclotron resonance) etching method, a parallel plate (capacitive coupled plasma) etching method, a magnetron plasma etching method, a dual-frequency plasma etching method, or a helicon wave plasma etching method is used.

For example, when an ICP etching method is used, etching may be performed under the following conditions: a flow rate of chlorine, which is an etching gas, is from 40 to 100 sccm; power applied to a coil electrode is from 100 to 200 W; power applied to a lower electrode (on the bias side) is from 40 to 100 W; and reaction pressure is from 0.5 to 1.0 Pa. In this embodiment mode, etching is performed under the following conditions: a flow rate of chlorine, which is an etching gas, is 100 sccm; reaction pressure is 1.0 Pa, a temperature of the lower electrode is 70° C.; RF (13.56 MHz) power applied to the coil electrode is 150 W; power applied to the lower electrode (on the bias side) is 40 W; and etching time is from 25 to 27 sec, and thereby the single crystal semiconductor layer 115 is thinned to a thickness of approximately 50 to 60 nm. As the etching gas, a chloride gas such as chlorine, boron chloride, silicon chloride or carbon tetrachloride; a fluoride gas such as carbon tetrafluoride, sulfur fluoride, or nitrogen fluoride; or oxygen may be used as appropriate.

By the etching, the thickness of the single crystal semiconductor layer 115 can be reduced to be optimal for a semiconductor element to be formed later and a surface of the single crystal semiconductor layer 115 can be planarized, as well.

Figure 10A:
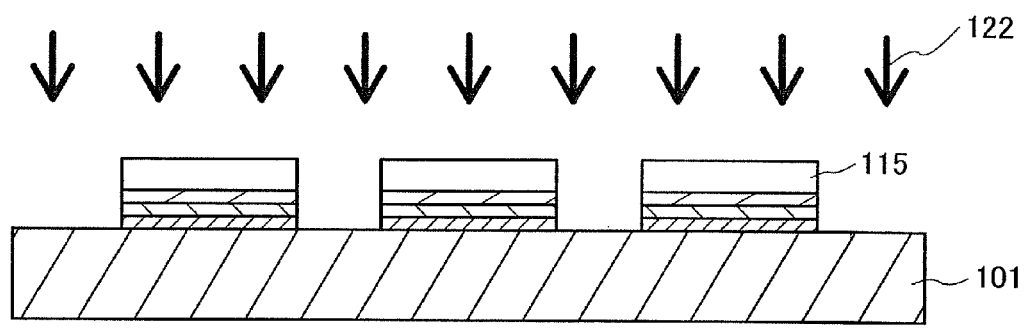
FIGS. 10A and 10B are views illustrating a method for manufacturing a semiconductor substrate.

Note that in the single crystal semiconductor layers 115 bonded to the base substrate 101, a crystal defect is caused due to division of the damaged region 113 and formation of the damaged region 113. Further, the planarity of a surface of the single crystal semiconductor layer 115 is lost. In order to reduce crystal defects and improve planarity, the single crystal semiconductor layers 115 are irradiated with a laser beam 122 as shown in FIG. 10A.

Figure 10B:
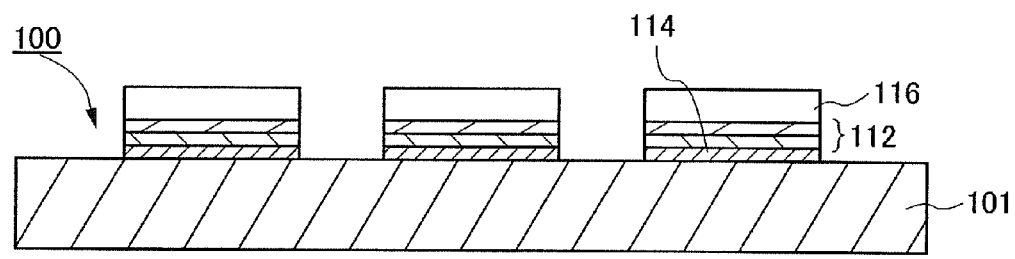

By irradiation with the laser beam 122 from the single crystal semiconductor layer 115 side, the single crystal semiconductor layer 115 is melted from a top surface thereof. After being melted, the single crystal semiconductor layer 115 is cooled and solidified to form a single crystal semiconductor layer 116 having a top surface of which planarity is improved, as shown in FIG. 10B. A perspective view of FIG. 10B corresponds to FIG. 1.

Note that in the case where a surface of the single crystal semiconductor layer 115 is planarized by dry etching before irradiation with the laser beam 122, a damage such as a crystal defect may be caused near the surface of the single crystal semiconductor layer 115 by dry etching. However, by irradiation with the laser beam 122, even the damage caused by dry etching can be repaired.

In this laser beam irradiation step, since the laser beam 122 is used so that a temperature rise of the base substrate 101 can be suppressed, a substrate with low resistance such as a glass substrate can be used as the base substrate 101. It is preferable that the single crystal semiconductor layer 115 be partially melted by being irradiated with the laser beam 122. This is because being completely melted, the single crystal semiconductor layer 115 is recrystallized due to disordered nucleation of the single crystal semiconductor layer 115 in a liquid phase and thereby having lower crystallinity. By partially melting the single crystal semiconductor layer 115, so-called longitudinal growth, in which crystal growth proceeds from a solid portion which is not melted, occurs in the single crystal semiconductor layer 115. Due to recrystallization by the longitudinal growth, crystal defects of the single crystal semiconductor layer 115 are reduced and crystallinity thereof is recovered. Note that the state where the single crystal semiconductor layer 115 is completely melted indicates, in the layered structure of FIG. 10A, that the portion from the top surface of the single crystal semiconductor layer 115 to the interface with the bonding layer 114 is melted and is in a liquid phase. On the other hand, the state where the single crystal semiconductor layer 115 is partially melted indicates that the upper layer thereof is melted and is in a liquid phase and a lower layer thereof is in a solid phase.

As a laser oscillator of the laser beam 122, the one of which the oscillation wavelength is in a range of from that of ultraviolet light to that of visible light is selected. The laser beam 122 is set to have a wavelength such that the laser beam 122 is absorbed by the single crystal semiconductor layer 115. The wavelength can be determined in consideration of the skin depth of the laser beam and the like. For example, a wavelength can be in the range of from 250 to 700 nm.

As the laser oscillator, a continuous wave laser oscillator, a pseudo continuous wave laser oscillator, or a pulsed laser oscillator can be used. A pulsed laser oscillator is preferable for partial melting. For example, in the case of a pulsed laser oscillator, a repetition rate thereof is 1 MHz or less and a pulse width is from 10 to 50 n seconds, inclusive. For example, an XeCl excimer laser oscillator with a repetition rate of from 10 to 300 Hz, a pulse width of 25 n sec, and a wavelength of 308 nm can be used.

The energy of the laser beam 122 can be determined in consideration of the wavelength and the skin depth of the laser beam 122, the thickness of the single crystal semiconductor layer 115, and the like. The energy of the laser beam 122 can be, for example, in the range of from 300 to 800 mJ/cm$^2$. For example, in the case where the thickness of the single crystal semiconductor layer 115 is approximately 120 nm, a pulsed laser oscillator is used as a laser oscillator, and the wavelength of the laser beam 122 is 308 nm, the energy density of the laser beam 122 can be from 600 to 700 mJ/cm$^2$.

Irradiation with the laser beam 122 is preferably performed in vacuum or in an inert atmosphere such as an atmosphere containing a rare gas or nitrogen. In order to perform irradiation with the laser beam 122 in an inert atmosphere, irradiation with the laser beam 122 may be performed in an airtight chamber while the atmosphere in the chamber is controlled. In the case where the chamber is not used, by blowing an inert gas such as a nitrogen gas to the surface irradiated with the laser beam 122, irradiation with the laser beam 122 in the inert atmosphere can be realized.

Irradiation with the laser beam 122 in the inert atmosphere such as nitrogen atmosphere or a vacuum state has a higher effect of improving planarity of the single crystal semiconductor layer 116 than that in the air atmosphere. In addition, since irradiation with the laser beam 122 in the inert atmosphere such as nitrogen atmosphere or a vacuum state has a higher effect of suppressing generation of cracks and ridges than that in the air atmosphere, the applicable energy range for the laser beam 122 is widened.

The laser beam 122 is preferably formed by an optical system such that energy distribution is equalized and a cross-sectional shape is a linear shape. Thus, irradiation with the laser beam 122 can be performed homogeneously with high throughput. In the case where the beam length of the laser beam 122 is longer than one side of the base substrate 101, all the single crystal semiconductor layers 115 bonded to the base substrate 101 can be irradiated with the laser beam 122 by one time scanning. In the case where the beam length of the laser beam 122 is shorter than one side of the base substrate 101, the beam length may be made to be long enough that all the single crystal semiconductor layers 115 bonded to the base substrate 101 can be irradiated with the laser beam 122, by performing scanning a plurality of times.

Note that treatment for removing an oxide film such as a natural oxide film formed on a surface of the single crystal semiconductor layer 115 is performed before the single crystal semiconductor layer 115 is irradiated with the laser beam 122. The oxide film is removed because a sufficient effect of planarization cannot be obtained when the single crystal semiconductor layer 115 is irradiated with the laser beam 122 with the oxide film left remaining on a surface thereof. For the treatment for removing the oxide film, the single crystal semiconductor layer 115 is processed with hydrofluoric acid. It is desirable that the hydrofluoric acid treatment be performed until a surface of the single crystal semiconductor layer 115 shows repellency. The repellency is shown, so that it can be confirmed that the oxide film is removed from the single crystal semiconductor layer 115.

The irradiation step of the laser beam 122 in FIG. 10A is performed as follows. First, the single crystal semiconductor layer 115 is processed for 110 seconds with hydrofluoric acid diluted to 1/100 so that the oxide film on a surface thereof is removed. As the laser oscillator of the laser beam 122, an XeCl excimer laser oscillator (wavelength: 308 nm, pulse width: 25 n sec, repetition rate: 60 Hz) is used. The cross section of the laser beam 122 is shaped into a linear shape having an area of 300 mm×0.34 mm by the optical system. The single crystal semiconductor layer 115 is irradiated with the laser beam 122 under the condition that a scanning velocity of the laser beam 122 is 2.0 mm/sec, a scan pitch is 33 μm, and the number of beam shots is approximately 10. The laser beam 122 is scanned with a nitrogen gas blown to the surface to be irradiated. In the cases where a size of the base substrate 101 is 730 mm×920 mm, by separating a region to be irradiated with the laser beam 122 into three regions, all the single crystal semiconductor layers 115 bonded to the base substrate 101 can be irradiated with the laser beam 122, because a beam length of the laser beam 122 is 300 mm.

Next, in the present invention, a surface of the single crystal semiconductor layer 116 may be etched as in the case of FIG. 8C. In the case where the surface of the single crystal semiconductor layer 116 is etched after irradiation with the laser beam, it is not necessary that a surface of the single crystal semiconductor layer 115 be etched before irradiation with the laser beam. Further, in the case where a surface of the single crystal semiconductor layer 115 is etched before irradiation with the laser beam, it is not necessary that a surface of the single crystal semiconductor layer 116 be etched after irradiation with the laser beam. In the present invention, etching may be performed both before and after irradiation with the laser beam.

By the etching, the thickness of the single crystal semiconductor layer 116 can be reduced to be optimal for a semiconductor element to be formed later and the surface of the single crystal semiconductor layer 116 can be planarized, as well.

After irradiation with the laser beam 122, heat treatment at from 500 to 650° C., inclusive is preferably performed on the single crystal semiconductor layer 116. By the heat treatment, a defect and deformation of the single crystal semiconductor layer 116, which are not recovered by irradiation with the laser beam 122, can be eliminated and alleviated, respectively. For the heating treatment, an RTA (rapid thermal anneal) apparatus, a resistance heating furnace, or a microwave heating apparatus may be used. As an RTA apparatus, a GRTA (gas rapid thermal anneal) apparatus, or an LRTA (lamp rapid thermal anneal) apparatus may be used. For example, in the case of using a resistance heating furnace, it is preferable that heating be performed at 500° C. for an hour and then heating be performed at 550° C. for four hours.

Through the above steps, the semiconductor substrate 100 shown in FIG. 1 and FIG. 10B can be formed. In this embodiment mode, since formation of the insulating layer 112, formation of the damaged region 113, and formation of the bonding layer 114 are performed while the plurality of single crystal semiconductor substrates 110 are mounted on the tray 10, the plurality of single crystal semiconductor substrates 110 can be processed together; therefore, the semiconductor substrate 100 can be formed with high throughput. Further, since the base substrate 101 and the single crystal semiconductor substrates 110 are bonded to each other while the single crystal semiconductor substrates 110 are mounted on the tray 10, the plurality of single crystal semiconductor layers 115 can be formed over the base substrate 101 easily with high throughput.

Note that although the steps in FIGS. 7A to 7C are performed without the single crystal semiconductor substrates 110 moved to another tray 10, the single crystal semiconductor substrates 110 may be put for each step in the tray 10 dedicated to an apparatus used in the step. For example, in the step of forming the insulating layer 112 in FIG. 7A, the tray 10 dedicated to a PECVD apparatus may be used, and in the step in FIG. 7B, the tray 10 dedicated to a doping apparatus may be used.

Alternatively, after the step of forming the insulating layer 112 in FIG. 7A, it is possible that the single crystal semiconductor substrates 110 over which the insulating layer 112 is formed are taken out from the tray 10, subjected to cleaning treatment such as ultrasonic cleaning, and then placed in another clean tray 10.

Alternatively, after the step of forming the damaged region 113 in FIG. 7B, it is possible that the single crystal semiconductor substrates 110 in which the damaged regions 113 are formed are taken out from the tray 10, subjected to cleaning treatment such as ultrasonic cleaning, and then placed in another clean tray 10.

(Embodiment Mode 2)

In this embodiment mode, reprocessing of a single crystal semiconductor substrate will be described. The single crystal semiconductor substrate 117 from which the single crystal semiconductor layer 115 has been separated, which is shown in FIG. 8B, is reprocessed. The reprocessing of a single crystal semiconductor substrate will be described with reference to FIGS. 11A to 11D.

Figure 11A:
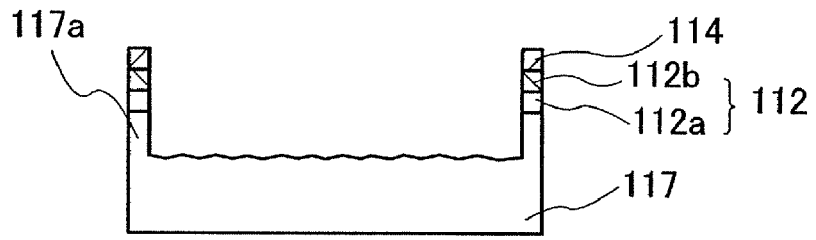
FIGS. 11A to 11D are views illustrating a method for recycling a single crystal semiconductor substrate.

After the step in FIG. 8B, a projected portion 117a has been formed over an end portion of the single crystal semiconductor substrate 117 and the insulating film 112b, the insulating film 112a, and the bonding layer 114, which have not been bonded to the base substrate 101, are left remaining over the projected portion 117a, as shown in FIG. 11A.

Figure 11B:
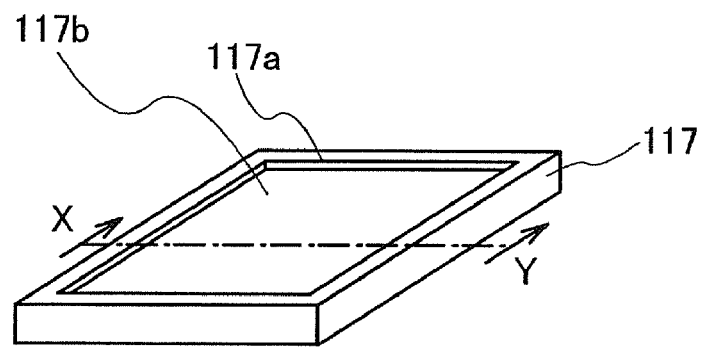
Figure 11C:
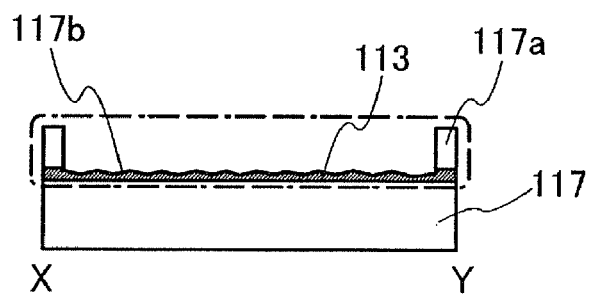

First, etching treatment for removing the insulating film 112b, the insulating film 112a, and the bonding layer 114 is performed. In the case where these films are each formed of silicon oxide, silicon oxynitride, or silicon nitride oxide, wet etching treatment using hydrofluoric acid is performed. By the etching treatment, the single crystal semiconductor substrate 117 is obtained as shown in FIG. 11B. FIG. 11C is a cross-sectional view taken along dashed-dotted line X-Y in FIG. 11B.

Next, the single crystal semiconductor substrate 117 shown in FIGS. 11B and 11C is etched so that the projected portion 117a and a separation plane 117b of the single crystal semiconductor layer 115 are removed. The portion surrounded by dashed-dotted line in FIG. 11C indicates the portion to be removed by the etching treatment. By the etching treatment, a region containing too much hydrogen, such as the damaged region 113 remaining in the single crystal semiconductor substrate 117, is removed. For the etching treatment of the single crystal semiconductor substrate 117, wet etching treatment is preferable, and a tetramethylammonium hydroxide (abbreviation: TMAH) solution can be used as an etchant.

Figure 11D:
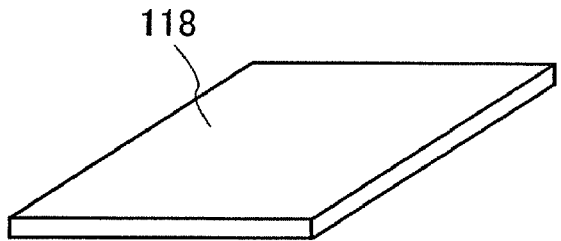

After the single crystal semiconductor substrate 117 is etched so that the projected portion 117a, the separation plane 117b, and the damaged region 113 which are shown in FIG. 11C are removed, the surface of the single crystal semiconductor substrate 117 is polished so that the single crystal semiconductor substrate 118 having a smooth surface is formed as shown in FIG. 11D. The single crystal semiconductor substrate 118 can be reused as the single crystal semiconductor substrate 110 shown in FIG. 2.

For the polishing treatment, chemical mechanical polishing (abbreviation: CMP) can be adopted. In order to smooth a surface of the single crystal semiconductor substrate 118, it is desirable that approximately 1 to 10 μm of the single crystal semiconductor substrate 118 be polished. After polishing, polish particles and the like are left remaining on a surface of the single crystal semiconductor substrate 118; therefore, cleaning with hydrofluoric acid or RCA cleaning is performed. Note that RCA cleaning refers to a cleaning method for a semiconductor substrate, which is developed by Radio Corporation of America, in which chemical in which hydrogen peroxide as a base is added with alkali or acid is used at high temperature.

By reusing the single crystal semiconductor substrate 118, the cost of a material of the semiconductor substrate 100 can be reduced.

(Embodiment Mode 3)

In this embodiment mode, a method for manufacturing a thin film transistor which is one of semiconductor elements will be described as one example of a method for manufacturing a semiconductor device using the semiconductor substrate 100. A plurality of thin film transistors are combined so that various semiconductor devices are formed. In this embodiment mode, the semiconductor substrate 100 manufactured by the manufacturing method of Embodiment Mode 1 is used.

Figure 12A:
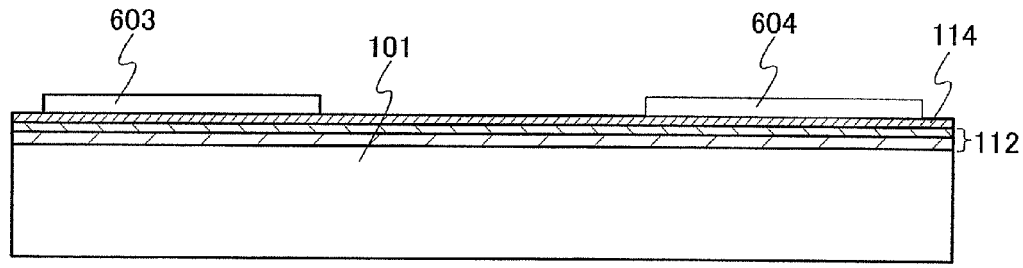
FIGS. 12A to 12D are views illustrating a method for manufacturing a semiconductor device using a semiconductor substrate.

First, as shown in FIG. 12A, the single crystal semiconductor layer 116 over the base substrate 101 is processed (patterned) to have a desired shape by etching, so that semiconductor films 603 and 604 are formed.

In order to control a threshold voltage, a p-type impurity such as boron, aluminum, or gallium or an n-type impurity such as phosphorus or arsenic may be added to the semiconductor films 603 and 604. For example, in the case where boron is added as an impurity imparting p-type conductivity, boron may be added at a concentration from $5\times10^{16}$ to $1\times10^{17}$ cm$^{-3}$, inclusive. The addition of an impurity for controlling a threshold voltage may be performed on the single crystal semiconductor layer 116 or the semiconductor films 603 and 604. Alternatively, the addition of an impurity for controlling a threshold voltage may be performed on the single crystal semiconductor substrate 110. Alternatively, it is possible that an impurity is added to the single crystal semiconductor substrate 110 to roughly adjust a threshold voltage and then an impurity is added to the single crystal semiconductor layer 116 or the semiconductor films 603 and 604 to finely adjust the threshold voltage.

After the semiconductor films 603 and 604 are formed, hydrotreatment may be performed before the gate insulating film 606 is formed. Hydrotreatment is performed, for example, in a hydrogen atmosphere at 350° C. for approximately two hours.

Figure 12B:
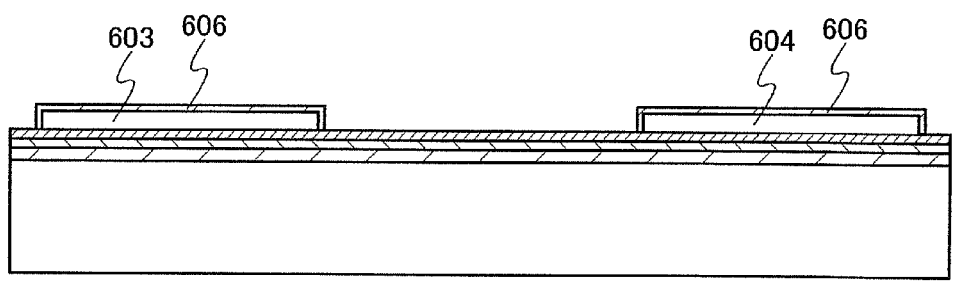

Next, as shown in FIG. 12B, the gate insulating film 606 is formed so as to cover the semiconductor film 603 and the semiconductor film 604. The gate insulating film 606 may be formed by performing a high-density plasma treatment on the semiconductor film 603 and the semiconductor film 604 to oxidize or nitride the surfaces thereof. The high-density plasma treatment is performed using a mixed gas of a rare gas such as He, Ar, Kr, or Xe and oxygen, nitrogen oxide, ammonia, nitrogen, hydrogen, or the like. When excitation of the plasma in this case is performed by introduction of a microwave, high density plasma can be generated at a low electron temperature. By oxidizing or nitriding the surfaces of the semiconductor films by an oxygen radical (there is a case where an OH radical is included) or a nitrogen radical (there is a case where an NH radical is included) generated by such high density plasma, an insulating film with a thickness of 1 to 20 nm, typically 5 to 10 nm is formed so as to be in contact with the semiconductor film. The 5 to 10 nm-thick insulating film is used as the gate insulating film 606.

Oxidation or nitridation of the semiconductor films by the above high-density plasma treatment proceeds due to a solid-phase reaction; therefore, interface state density between the gate insulating film and the semiconductor films can be extremely reduced. Further, since the semiconductor films are directly oxidized or nitrided by the high-density plasma treatment, variation in thickness of the insulating film to be formed can be suppressed. In a case where the semiconductor films have crystallinity, by oxidizing surfaces of the semiconductor films due to a solid-phase reaction by the high-density plasma treatment, rapid oxidation only in a crystal grain boundary can be prevented, and thus a gate insulating film with good uniformity and low interface state density can be formed. When a transistor in which a gate insulating film partially or entirely includes the insulating film formed by high-density plasma treatment is used, variations in characteristics thereof can be suppressed.

Alternatively, the semiconductor films 603 and 604 may be thermally oxidized so that the gate insulating films 606 are formed. The gate insulating film 606 may be formed to have a single-layer or layered structure of a film containing silicon oxide, silicon nitride oxide, silicon nitride, hafnium oxide, aluminum oxide, or tantalum oxide by a plasma CVD method, a sputtering method, or the like.

Alternatively, it is possible that the gate insulating film 606 containing hydrogen is formed and then heat treatment is performed at a temperature of 350 to 450° C., so that hydrogen contained in the gate insulating film 606 is diffused into the semiconductor films 603 and 604. In that case, the gate insulating film 606 may be formed by depositing silicon nitride or silicon nitride oxide by a plasma CVD method at a process temperature of 350° C. or less. By supplying hydrogen to the semiconductor films 603 and 604, such defects as to serve as trapping centers in the semiconductor films 603 and 604 and at an interfaces of the gate insulating film 606 and the semiconductor films 603 and 604 can be reduced effectively.

Figure 12C:
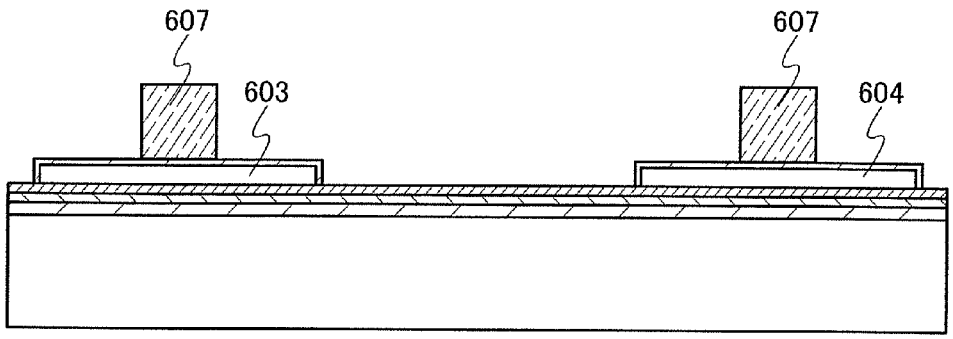

Next, as shown in FIG. 12C, after a conductive film is formed over the gate insulating film 606, the conductive film is processed (patterned) to have a predetermined shape so that electrodes 607 are formed over the semiconductor films 603 and 604. For the formation of the conductive film, a CVD method, a sputtering method, or the like may be used. As the conductive film, tantalum (Ta), tungsten (W), titanium (Ti), molybdenum (Mo), aluminum (Al), copper (Cu), chromium (Cr), niobium (Nb), or the like may be used. Alternatively, an alloy or compound containing any of the above-mentioned metals as the main component may be used. Alternatively, the electrode 607 may be formed of a semiconductor such as polycrystalline silicon doped with an impurity element such as phosphorus, which imparts conductivity, to the semiconductor film.

Further, although the electrode 607 is formed of a single-layer conductive film in this embodiment mode, the structure in this embodiment mode is not limited thereto. The electrode 607 may be formed of a plurality of conductive films which are stacked. For a combination of two conductive films, tantalum nitride or tantalum (Ta) and tungsten (W) may be used for a first layer and a second layer, respectively. Other than the combination, the following combinations are given: tungsten nitride and tungsten; molybdenum nitride and molybdenum; aluminum and tantalum; aluminum and titanium, and the like. Since tungsten and tantalum nitride have high heat resistance, thermal treatment can be performed for thermal activation in the step after formation of the two-layer conductive films. Moreover, as a combination of the two-layer conductive films, for example, the following combinations are also given: nickel silicide and silicon doped with an impurity imparting n-type conductivity; $WSi_x$ and Si doped with an impurity imparting n-type conductivity; and the like.

In the case of adopting a three-layer structure in which three or more conductive films are stacked, a layered structure of a molybdenum film, an aluminum film, and a molybdenum film is preferable.

For a mask which is used to form the electrodes 607, silicon oxide, silicon nitride oxide, or the like may be used instead of a resist. In that case, a step is added in which the mask of silicon oxide, silicon nitride oxide, or the like is formed by patterning. However, film reduction of a mask in etching is smaller than that of a resist, so the electrodes 607 each with a desired width can be formed. Alternatively, the electrodes 607 may be formed as selected by a droplet-discharge method without using a mask.

Note that a droplet-discharge method is a method in which a predetermined pattern is formed by discharging or ejecting droplets containing a predetermined composition and an ink-jet method is included in the category.

The electrode 607 can be etched to have a desired tapered shape by an ICP (inductively coupled plasma) etching method and appropriate control of the etching conditions (e.g., the amount of power applied to a coiled electrode layer, the amount of power applied to an electrode layer on the substrate side, and the electrode temperature on the substrate side). Further, an angle and the like of the taper shape can also be controlled by the shape of the mask. As the etching gas, a chloride gas such as chlorine, boron chloride, silicon chloride or carbon tetrachloride; a fluoride gas such as carbon tetrafluoride, sulfur fluoride, or nitrogen fluoride; or oxygen is used as appropriate.

Figure 12D:
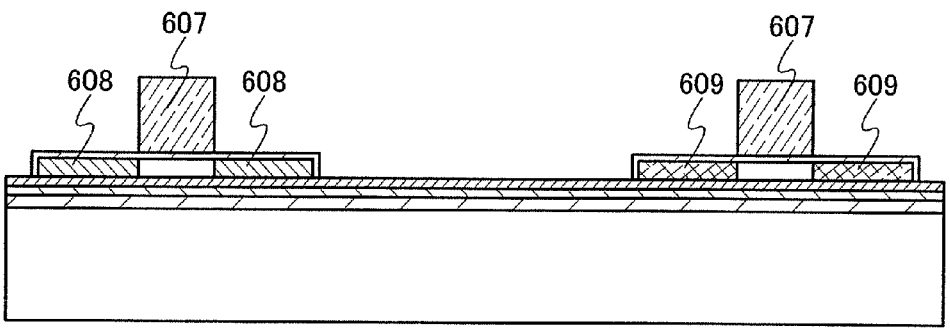

Next, as shown in FIG. 12D, an impurity element imparting one conductivity type is added to the semiconductor films 603 and 604 with the use of the electrodes 607 as masks. In this embodiment mode, an impurity element imparting p-type conductivity (e.g., boron) is added to the semiconductor film 604, and an impurity element imparting n-type conductivity (e.g., phosphorus or arsenic) is added to the semiconductor film 603. Note that when the impurity element imparting p-type conductivity is added to the semiconductor film 604, the semiconductor film 603 to which the n-type impurity is added is covered with a mask or the like so that the addition of the impurity element imparting p-type conductivity is performed selectively. On the other hand, when the impurity element imparting n-type conductivity is added to the semiconductor film 603, the semiconductor film 604 to which the p-type impurity is added is covered with a mask or the like so that the addition of the impurity element imparting n-type conductivity can be performed selectively. Alternatively, after the impurity element imparting p-type or n-type conductivity is added to the semiconductor film 603 and the semiconductor film 604, either one of the impurity element imparting p-type conductivity or the impurity element imparting n-type conductivity may be selectively added to only one of the semiconductor film 603 or the semiconductor film 604 at higher concentration. By the above-described addition of the impurity, impurity regions 608 and 609 are formed in the semiconductor films 603 and 604, respectively.

Figure 13A:
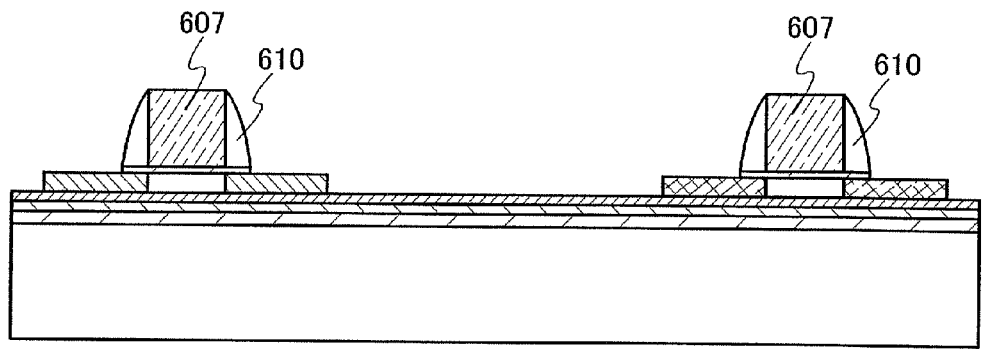
FIGS. 13A to 13C are views illustrating a method for manufacturing a semiconductor device using a semiconductor substrate.

Next, as shown in FIG. 13A, a sidewall 610 is formed on side surfaces of each of the electrodes 607. For example, the sidewall 610 can be formed in such a manner that another insulating film is formed so as to cover the gate insulating film 606 and the electrode 607, and the insulating film is partially etched by anisotropic etching mainly in a perpendicular direction. The insulating film is partially etched by the anisotropic etching, thereby the sidewall 610 is formed on the side surfaces of each of the electrodes 607. Note that the gate insulating film 606 may also be partially etched by the anisotropic etching. The insulating film for forming the sidewall 610 may be formed of a single layer such as a silicon film, a silicon oxide film, a silicon nitride oxide film, or a film containing an organic material such as an organic resin or a laminate thereof by a plasma CVD method, a sputtering method, or the like. In this embodiment mode, a silicon oxide film is formed to a thickness of 100 nm by a plasma CVD method. In addition, as an etching gas, a mixed gas of $CHF_3$ and helium can be used. Note that the steps of forming the sidewall 610 are not limited to these steps.

Figure 13B:
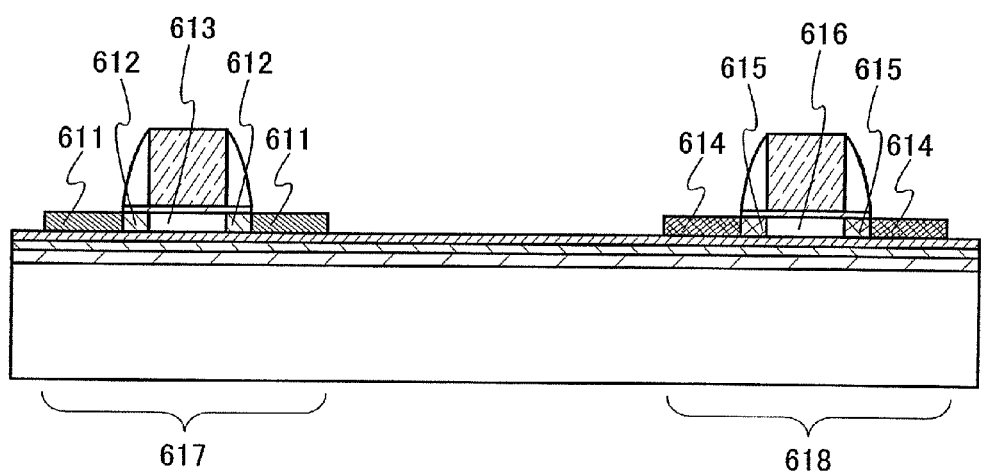

Next, as shown in FIG. 13B, an impurity element imparting one conductivity type is added to the semiconductor films 603 and 604 with the use of the electrodes 607 and the sidewalls 610 as masks. Note that the impurity elements imparting the same conductivity type as the impurity elements which have been added to the semiconductor films 603 and 604 in the previous step are added to the semiconductor films 603 and 604 at higher concentration than in the previous step. Note that when the impurity element imparting p-type conductivity is added to the semiconductor film 604, the semiconductor film 603 to which the n-type impurity is added is covered with a mask or the like so that the addition of the impurity element imparting p-type conductivity can be performed selectively. On the other hand, when the impurity element imparting n-type conductivity is added to the semiconductor film 603, the semiconductor film 604 to which the p-type impurity element is added is covered with a mask or the like so that the addition of the impurity element imparting n-type conductivity can be performed selectively.

By the above-described addition of the impurity element, a pair of high concentration impurity regions 611, a pair of low concentration impurity regions 612, and a channel formation region 613 are formed in the semiconductor film 603. In addition, by the above-described addition of the impurity element, a pair of high concentration impurity regions 614, a pair of low concentration impurity regions 615, and a channel formation region 616 are formed in the semiconductor film 604. One of the high concentration impurity regions 611 functions as a source and the other functions as a drain, one of the high concentration impurity regions 614 functions as a source and the other functions as a drain, and the low concentration impurity regions 612 and 615 function as LDD (lightly doped drain) regions.

Note that the sidewall 610 formed over the semiconductor film 604 and the sidewall 610 formed over the semiconductor film 603 may be formed so as to have the same width in a direction in which carriers flow, or may be formed so as to have different widths. It is preferable that the width of the sidewall 610 over the semiconductor film 604 which constitutes a part of a p-channel transistor be larger than the width of the sidewall 610 over the semiconductor film 603 which constitutes a part of an n-channel transistor. This is because boron which is added for forming a source and a drain in the p-channel transistor is easily diffused and a short channel effect is easily induced. When the width of the sidewall 610 in the p-channel transistor is made larger, boron can be added to the source and the drain at high concentration, and thus the resistance of the source and the drain can be reduced.

Next, a silicide layer may be formed by silicification of the semiconductor films 603 and 604 in order to further reduce the resistance of the source and the drain. The silicification is performed in such a manner that a metal is brought into contact with the semiconductor film, and silicon in the semiconductor film is made to react with the metal by heat treatment, a GRTA method, an LRTA method, or the like. Cobalt silicide or nickel silicide may be used for the silicide layer. In the case where the semiconductor films 603 and 604 are thin, silicide reaction may be proceeded to bottoms of the semiconductor films 603 and 604 in this region. As a metal material used for the silicification, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, silicide may be formed by laser irradiation or light irradiation using a lamp or the like.

Through the above steps, an n-channel transistor 617 and a p-channel transistor 618 are formed.

Figure 13C:
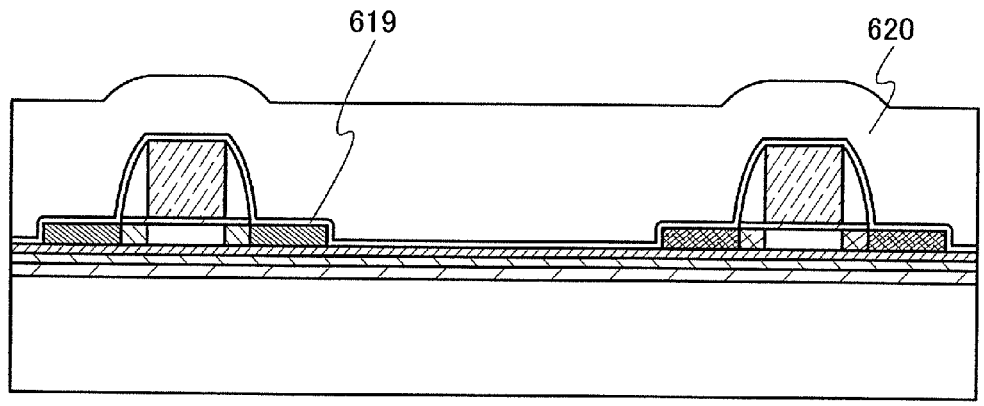

Next, as shown in FIG. 13C, an insulating film 619 is formed so as to cover the transistors 617 and 618. The insulating film 619 is not necessarily provided; however, by forming the insulating film 619, an impurity such as alkali metal or alkaline earth metal can be prevented from entering the transistors 617 and 618. Specifically, silicon nitride, silicon nitride oxide, aluminum nitride, aluminum oxide, silicon oxide, or the like is desirably used for the insulating film 619. In this embodiment mode, a silicon nitride oxide film with a thickness of approximately 600 nm is used as the insulating film 619. In this case, the hydrogenation process described above may be performed after formation of the silicon nitride oxide film.

Next, an insulating film 620 is formed over the insulating film 619 so as to cover the transistors 617 and 618. For the insulating film 620, an organic material having heat resistance, such as polyimide, acrylic, benzocyclobutene, polyamide, or epoxy can be used. Alternatively, a low-dielectric constant material (low-k material), a siloxane resin, silicon oxide, silicon nitride, silicon nitride oxide, PSG (phosphosilicate glass), BPSG (borophosphosilicate glass), alumina, or the like may be used. A siloxane resin may contain at least one of fluorine, an alkyl group, and aromatic hydrocarbon besides hydrogen as a substituent. Note that the insulating film 620 may be formed by stacking a plurality of insulating films formed of any of the above materials. A surface of the insulating film 620 may be planarized by a CMP method or the like.

Note that the siloxane-based resin corresponds to a resin including a Si—O—Si bond, which is formed using a siloxane-based material as a starting material. The siloxane-based resin may have at least one of fluorine, an alkyl group, or aromatic hydrocarbon besides hydrogen as a substituent.

The insulating film 620 can be formed by a CVD method, a sputtering method, an SOG method, spin coating, dipping, spray coating, a droplet discharging method (an ink-jet method, screen printing, offset printing, or the like), a doctor knife, a roll coater, a curtain coater, a knife coater, or the like depending on a material of the insulating film 620.

Figure 14:
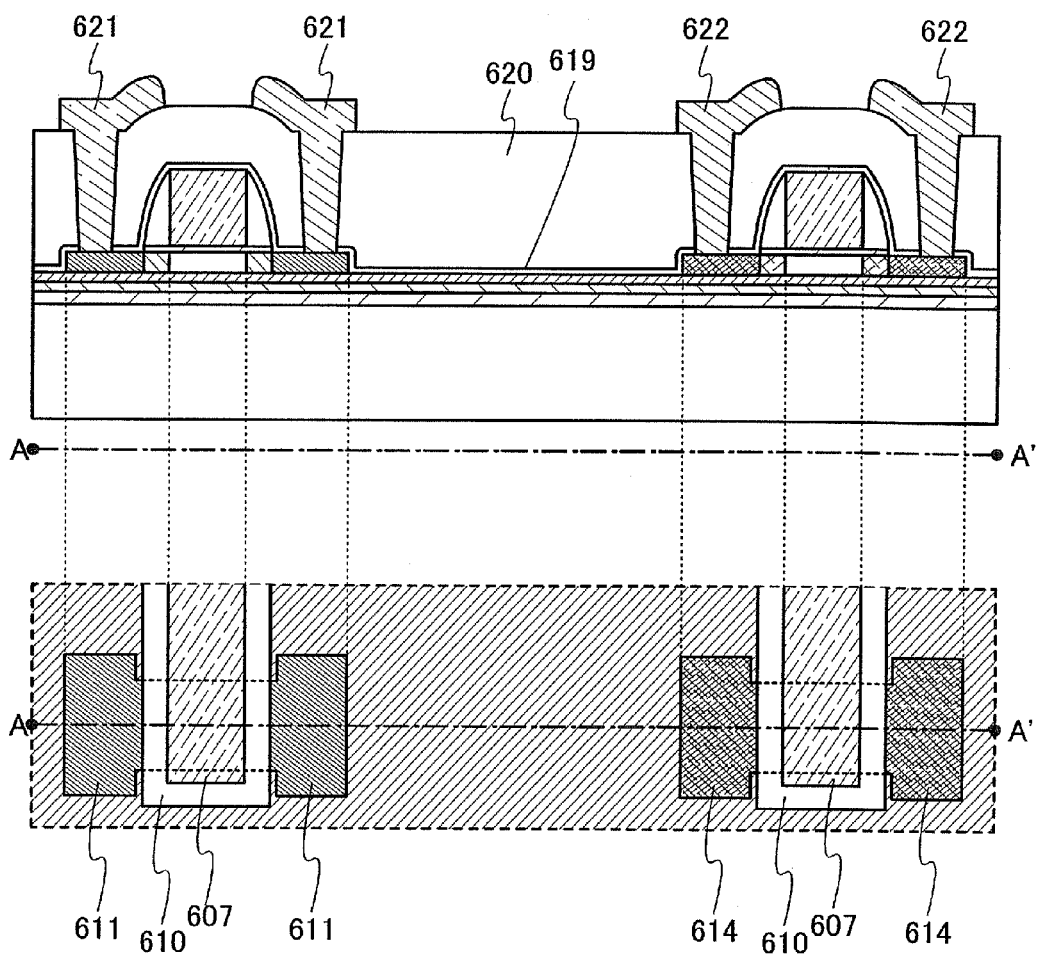
FIG. 14 is a view illustrating a method for manufacturing a semiconductor device using a semiconductor substrate.

Next, as shown in FIG. 14, contact holes are formed in the insulating film 619 and the insulating film 620 so that each of the semiconductor films 603 and 604 is partially exposed. Then, conductive films 621 and 622 which are in contact with the semiconductor films 603 and 604, respectively, through the contact holes are formed. As an etching gas for forming the contact holes, a mixed gas of $CHF_3$ and He is adopted; however, the present invention is not limited thereto.

The conductive films 621 and 622 can be formed by a CVD method, a sputtering method, or the like. Specifically, for the conductive films 621 and 622, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like; an alloy containing any of the above metals as its main component; or a compound containing any of the above metals may be used. The conductive films 621 and 622 can be formed to have a single-layer or layered structure of a film using any of the above metals.

As examples of an alloy containing aluminum as its main component, an alloy containing aluminum as its main component and also containing nickel, an alloy containing aluminum as its main component and also containing nickel and one or both of carbon and silicon are given. Aluminum and aluminum silicon are optimal for a material for forming the conductive films 621 and 622 because they have low resistance and are inexpensive. In particular, an aluminum silicon (Al—Si) film can prevent generation of a hillock in resist baking when the conductive films 621 and 622 are pattered, compared to an aluminum film. Cu may be mixed into an aluminum film by approximately 0.5% instead of silicon (Si).

For the conductive films 621 and 622, for example, a layered structure of a barrier film, an aluminum silicon (Al—Si) film, and a barrier film or a layered structure of a barrier film, an aluminum silicon (Al—Si) film, a titanium nitride film, and a barrier film is preferably used. Note that a barrier film is a film formed using titanium, an oxide of titanium, molybdenum, or a nitride of molybdenum. When barrier films are formed so as to interpose an aluminum silicon (Al—Si) film, generation of a hillock of aluminum or aluminum silicon can be further prevented. Further, when a barrier film is formed using titanium that is a highly-reducible element, even if a thin oxide film is formed over the semiconductor films 603 and 604, the oxide film is reduced by titanium contained in the barrier film so that preferable contact between the conductive film 621 and the semiconductor film 603 and between the conductive film 622 and the semiconductor film 604 can be obtained. Alternatively, a plurality of barrier films may be stacked to be used. In that case, for example, the conductive films 621 and 622 can be each formed to have a five-layer structure in which titanium, titanium nitride, aluminum silicon, titanium, and titanium nitride are sequentially stacked.

Alternatively, as the conductive films 621 and 622, tungsten silicide formed from a $WF_6$ gas and a $SiH_4$ gas by a chemical vapor deposition method may be used. Alternatively, tungsten formed by hydrogen reduction of $WF_6$ may be used.

Note that the conductive films 621 are connected to the high concentration impurity regions 611 of the n-channel transistor 617. The conductive films 622 are connected to the high concentration impurity regions 614 of the p-channel transistor 618.

FIG. 14 includes the top plan view of the n-channel transistor 617 and the p-channel transistor 618. It is to be noted that the conductive films 621 and 622 and the insulating films 619 and 620 are omitted in the top plan view of FIG. 14.

Further, although this embodiment mode exemplifies the case where the n-channel transistor 617 and the p-channel transistor 618 each has one of the electrodes 607 functioning as a gate, the present invention is not limited to this structure. The transistor manufactured in the present invention may have a plurality of electrodes each functioning as a gate and may have a multi-gate structure in which the plurality of electrodes are electrically connected to one another.

Alternatively, the transistor included in the semiconductor device manufactured according to the present invention may have a gate planar structure.

Note that obtained is a semiconductor film included in an SOI substrate, which has characteristics similar to those of a single crystal semiconductor film. Therefore, since the semiconductor film included in the SOI substrate has smaller variation in orientation than a polycrystalline semiconductor film, variation in a threshold voltage of a transistor can be small. In addition, since the semiconductor film included in the SOI substrate includes few crystal grain boundaries, a leakage current attributed to the crystal boundaries can be suppressed and thus power consumption of the semiconductor device can be saved. In the case of a polycrystalline semiconductor film obtained by laser crystallization, a projection (ridge) is likely to be formed on a surface thereof due to distribution in energy density in a beam spot. However, irradiation may be performed on the semiconductor film included in the SOI substrate at low energy density such that a defect in a semiconductor film, which is caused by bonding, can be recovered. Therefore, since planarity of a surface of the semiconductor film included in the SOI substrate is significantly higher than that of a polycrystalline semiconductor film obtained by laser crystallization, the thickness of a gate insulating film formed over the semiconductor film included in the SOI substrate can be reduced to approximately 5 to 50 nm. Accordingly, a high on current can be obtained with a gate voltage prevented from increasing. In addition, in the case of using a polycrystalline semiconductor film obtained by laser crystallization, in order to obtain higher mobility, it is necessary that arrangement of the semiconductor film included in a transistor be determined in a scan direction of a laser beam; however, in the case of a semiconductor film included in an SOI substrate, there is not such a necessity, so limitations on the design of a semiconductor device are reduced.

[Embodiment 1]

In this embodiment, the specific configuration of various circuits included in the semiconductor device of the present invention will be described taking an inverter as an example. As an example, FIG. 15A shows a circuit diagram of an inverter and FIG. 15B shows a top plan view of the inverter shown in FIG. 15A.

Figure 15A:
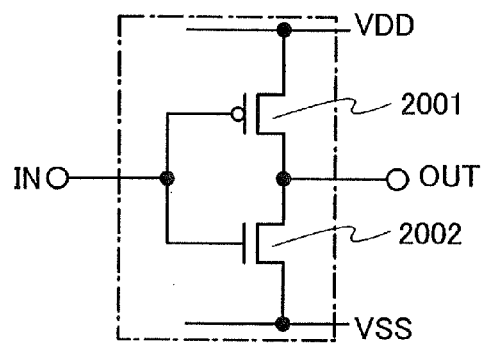
FIGS. 15A and 15B are diagrams illustrating a structure of an inverter formed using a manufacturing method of the present invention.

The inverter shown in FIG. 15A has p-channel transistors 2001 and n-channel transistors 2002. The transistors 2001 and the transistors 2002 are connected in series. Specifically, drains of the transistors 2001 and drains of the transistors 2002 are connected. The potential of the drains of the transistors 2001 and the drains of the transistors 2002 is applied to an output terminal OUT.

Further, gates of the transistors 2001 and gates of the transistors 2002 are connected. The potential of a signal inputted to an input terminal IN is applied to the gates of the transistors 2001 and the gates of the transistors 2002. A high level voltage VDD is applied to sources of the transistors 2001 while a low level voltage VSS is applied to sources of the transistors 2002.

Figure 15B:
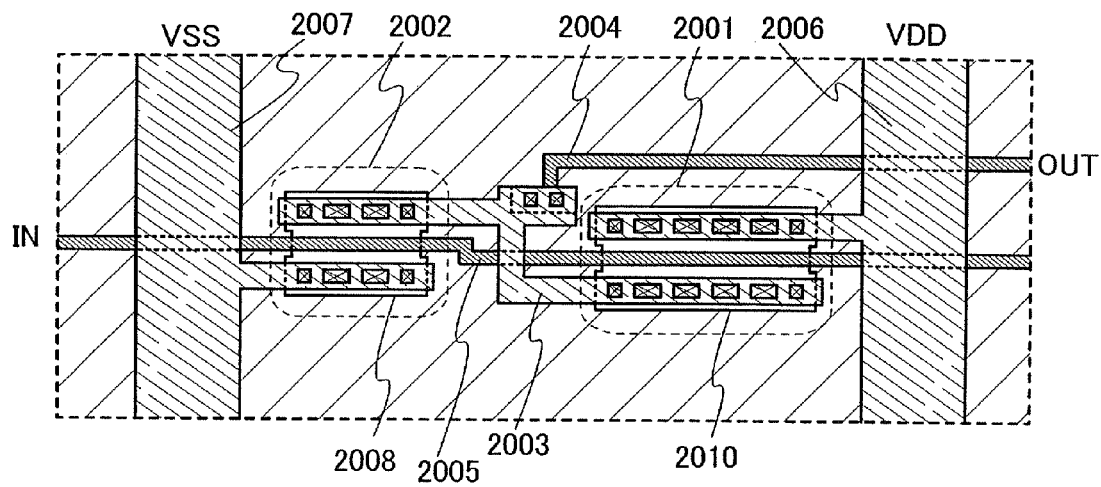

In the inverter shown in FIG. 15B, the transistor 2001 includes a semiconductor film 2010 and the transistor 2002 includes a semiconductor film 2008. Further, the drains of the transistors 2001 and the drains of the transistors 2002 are electrically connected through a wiring 2003. The wiring 2003 is connected to a wiring 2004. Therefore, the potential of the drains of the transistors 2001 and the drains of the transistors 2002 is applied as the potential of the output terminal OUT to a circuit of the next stage through the wiring 2003 and the wiring 2004.

Further, in the inverter shown in FIG. 15B, parts of a wiring 2005 function as the gates of the transistors 2001 and the gates of the transistors 2002. The potential applied to the wiring 2005 is applied to the gates of the transistors 2001 and the gates of the transistors 2002 as the potential of the input terminal IN. The high level voltage VDD is applied to the sources of the transistors 2001 through a wiring 2006, and the low level voltage VSS is applied to the sources of the transistors 2002 through a wiring 2007.

This embodiment can be implemented in combination with any of the above embodiment modes as appropriate.

[Embodiment 2]

In this embodiment, the specific configuration of various circuits included in the semiconductor device of the present invention will be described taking a NAND as an example. As an example, FIG. 16A shows a circuit diagram of the NAND and FIG. 16B shows a top plan view of the NAND shown in FIG. 16A.

Figure 16A:
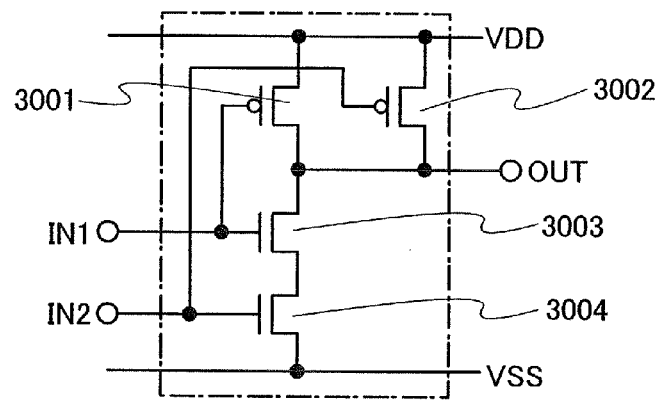
FIGS. 16A and 16B are diagrams illustrating a structure of a NAND formed using a manufacturing method of the present invention.

The NAND shown in FIG. 16A has a p-channel transistor 3001, a p-channel transistor 3002, an n-channel transistor 3003, and an n-channel transistor 3004. The transistor 3001, the transistor 3003, and the transistor 3004 are connected in series in this order. Meanwhile, the transistor 3001 and the transistor 3002 are connected in parallel.

Specifically, a high level voltage VDD is applied to either of a source or a drain of the transistor 3001 and the other is connected to an output terminal OUT. A high level voltage VDD is applied to either of a source or a drain of the transistor 3002 and the other is connected to the output terminal OUT. A low level voltage VSS is applied to either of a source or a drain of the transistor 3004. Either of a source or a drain of the transistor 3003 is connected to the output terminal OUT. Further, the other of the source or the drain of the transistor 3003 is connected to the other of the source or the drain of the transistor 3004. The potential of an input terminal IN1 is applied to gates of the transistor 3001 and the transistor 3003. Further, the potential of an input terminal IN2 is applied to gates of the transistor 3002 and the transistor 3004.

Figure 16B:
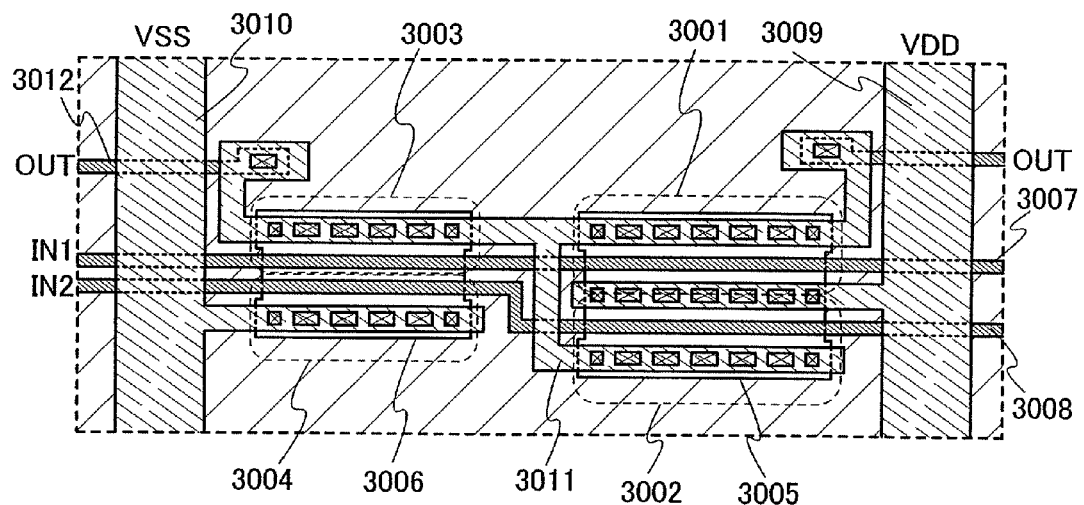

In the NAND shown in FIG. 16B, the transistor 3001 and the transistor 3002 which are connected in parallel share a semiconductor film 3005. Meanwhile, the transistor 3003 and the transistor 3004 which are connected in series share a semiconductor film 3006. Further, parts of a wiring 3007 function as the gates of the transistor 3001 and the transistor 3003. The potential applied to the wiring 3007 is applied to the gates of the transistor 3001 and the transistor 3003 as the potential of the input terminal IN1. Parts of a wiring 3008 function as the gates of the transistor 3002 and the transistor 3004. The potential applied to the wiring 3008 is applied to the gates of the transistor 3002 and the transistor 3004 as the potential of the input terminal IN2.

The high level voltage VDD is applied to either the source or the drain of the transistor 3001 and either the source or the drain of the transistor 3002 through a wiring 3009. Further, the low level voltage VSS is applied to either the source or the drain of the transistor 3004 through a wiring 3010. The potentials of the other of the source or the drain of the transistors 3001, the other of the source or the drain of the transistor 3002, and either the source or the drain of the transistor 3003 are applied as the potential of the output terminal OUT to a circuit of the next stage through a wiring 3011 and a wiring 3012.

This embodiment can be implemented in combination with any of the above embodiment modes and embodiment as appropriate.

[Embodiment 3]

Figure 17A:
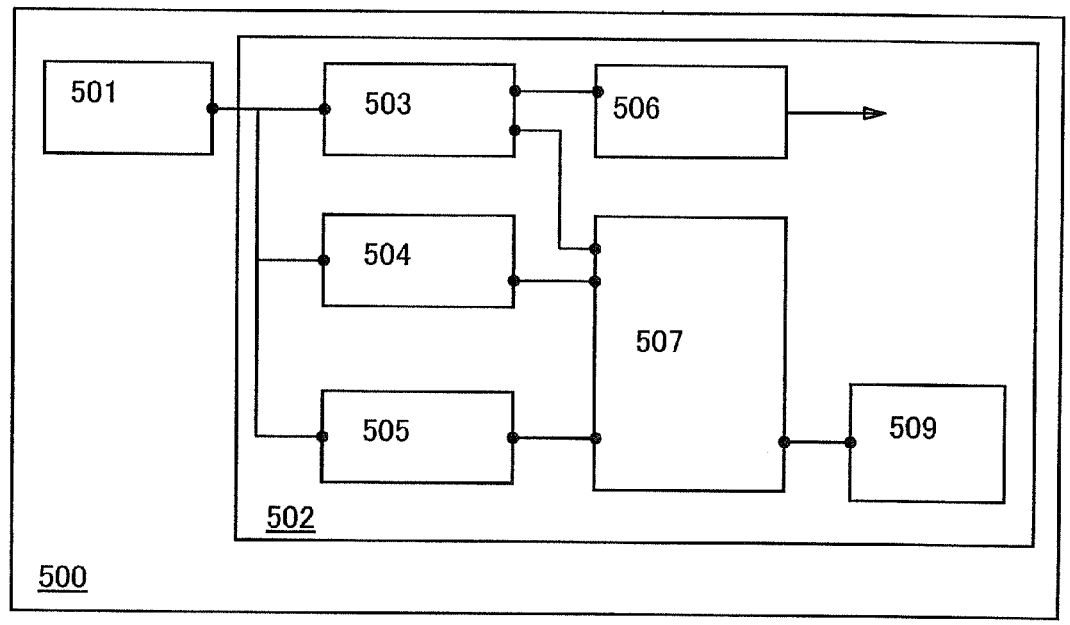
FIGS. 17A and 17B are diagrams illustrating semiconductor devices each formed using a manufacturing method of the present invention.

This embodiment will describe the configuration of an RF tag which is one of the semiconductor devices of the present invention. FIG. 17A is a block diagram illustrating one mode of the RF tag of the present invention. In FIG. 17A, an RF tag 500 includes an antenna 501 and an integrated circuit 502. The integrated circuit 502 includes a power supply circuit 503, a demodulation circuit 504, a modulation circuit 505, a regulator 506, a control circuit 507, and a memory 509.

When a radio wave is transmitted from an interrogator, the radio wave is converted into an AC voltage in the antenna 501. In the power supply circuit 503, the AC voltage from the antenna 501 is rectified to generate a voltage for a power source. The voltage for a power source, which is generated in the power supply circuit 503, is applied to the control circuit 507 and the regulator 506. After stabilizing the voltage for a power source from the power supply circuit 503 or after adjusting the level thereof, the regulator 506 supplies the voltage to various circuits in the integrated circuit 502, such as the demodulation circuit 504, the modulation circuit 505, the control circuit 507, and the memory 509.

The demodulation circuit 504 demodulates an AC voltage from the antenna 501 to generate a signal and outputs the signal to the control circuit 507 of the next stage. The control circuit 507 performs arithmetic processing in accordance with the signal inputted from the demodulation circuit 504 and generates another signal. When the arithmetic processing is performed, the memory 509 can be used as a primary cache memory or a secondary cache memory. The control circuit 507 analyzes the signal inputted from the demodulation circuit 504, and outputs data in the memory 509 or stores the content of instruction in the memory 509 in accordance with the content of the instruction transmitted from the interrogator. The signal outputted from the control circuit 507 is encoded and then outputted to the modulation circuit 505. The modulation circuit 505 modulates a radio wave received by the antenna 501 in accordance with the signal. The radio wave modulated in the antenna 501 is received by the interrogator. Thus, data outputted from the RF tag 500 can be known.

Thus, communication between the RF tag 500 and the interrogator can be performed by modulating a radio wave used as a carrier (carrier wave). The frequency of the carrier is, depending on a standard, 125 kHz, 13.56 MHz, 950 MHz, or the like. A demodulation method is, depending on a standard, amplitude modulation, frequency modulation, phase modulation, or the like; however, any modulation method may be used as long as it meets a standard.

A signal transmission method can be categorized into an electromagnetic coupling method, an electromagnetic induction method, a microwave method, and the like in accordance with the wavelength of a carrier.

The memory 509 may be either a nonvolatile memory or a volatile memory. As the memory 509, an SRAM, a DRAM, a flash memory, an EEPROM, an FeRAM, or the like may be used.

In this embodiment, the configuration of the RF tag 500 including the antenna 501 is described; however, the RF tag of the present invention does not necessarily include an antenna. In addition, the RF tag illustrated in FIG. 17A may be provided with an oscillation circuit or a secondary battery.

In FIG. 17A, the configuration of the RF tag including only one antenna is described; however, the present invention is not limited to this configuration. An RF tag may include two antennas, that is, an antenna for receiving power and an antenna for receiving a signal. If an RF tag includes one antenna, in a case where both supply of power and transmission of a signal are performed with a radio wave of 950 MHz for example, there is a possibility that a large amount of power is transmitted over a distance and reception of other wireless devices is prevented. Therefore, it is desirable that power be supplied in a short distance with a radio wave having decreased frequency; however, a communication distance is inevitably short in that case. On the other hand, if an RF tag includes two antennas, frequency of a radio wave for supplying power and frequency of a radio wave for transmitting a signal can be separately used. For example, in the case of transmitting power, a radio wave with a frequency of 13.56 MHz and a magnetic field are used, and in the case of transmitting a signal, a radio wave with a frequency of 950 MHz and an electric field are used. Thus, by separately using antennas depending on functions, power can be supplied for communication only in a short distance and a signal can be transmitted even in a long distance.

In the RF tag which is one of semiconductor devices of the present invention, the integrated circuit 502 can be formed using a single crystal semiconductor layer (SOI layer) which is bonded to a substrate having an insulating surface or an insulating substrate; therefore, not only faster processing speed but also lower power consumption can be achieved. Further, in the present invention, productivity can be increased while a base substrate is increased in size, so that the cost for each RF tag can be reduced.

This embodiment can be implemented in combination with any of the above embodiment modes and embodiments as appropriate.

Next, the configuration of a CPU (central processing unit) which is one of the semiconductor devices of the present invention will be described.

Figure 17B:
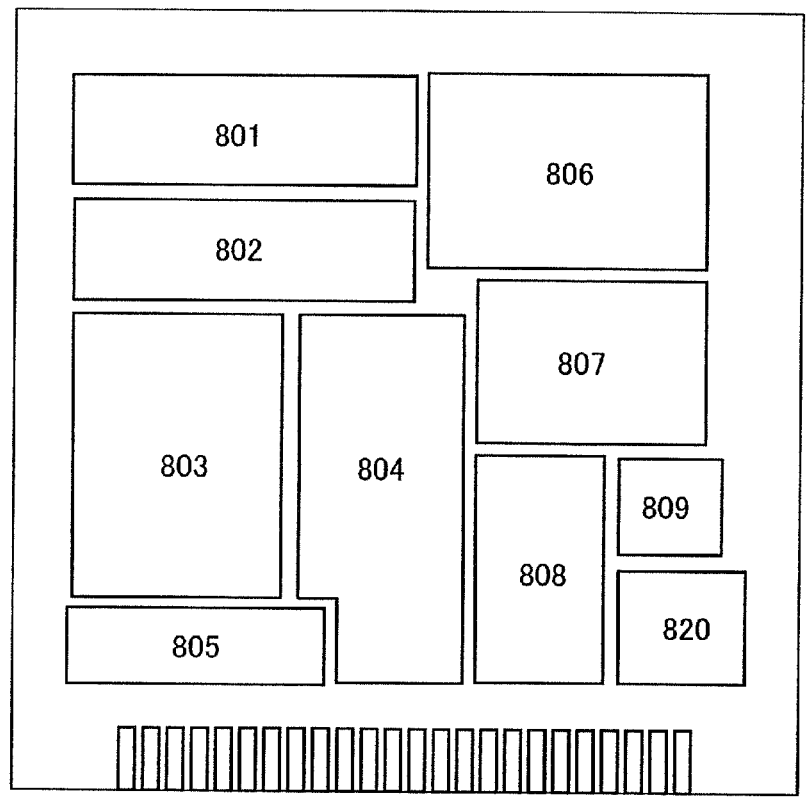

Further, a specific configuration of the CPU of the present embodiment will be described with reference to a block diagram. In a CPU shown in FIG. 14, an arithmetic logic unit (ALU) 801, an ALU controller 802, an instruction decoder 803, an interrupt controller 804, a timing controller 805, a register 806, a register controller 807, a bus interface (Bus I/F) 808, a memory 809 and a memory interface (ROM I/F) 820 are mainly formed over a substrate 800. The memory 809 and the memory interface 820 may be provided over a separate chip. It is needless to say that the CPU shown in FIG. 17B is only an example in which a configuration is simplified, and an actual CPU may have various configurations depending on the application.

An instruction inputted to the CPU through the bus interface 808 is inputted to the instruction decoder 803 and decoded therein, and then, inputted to the ALU controller 802, the interrupt controller 804, the register controller 807 and the timing controller 805. The ALU controller 802, the interrupt controller 804, the register controller 807 and the timing controller 805 conduct various controls based on the decoded instruction. Specifically, the ALU controller 802 generates signals to control the drive of the ALU 801. While the CPU is executing a program, the interrupt controller 804 determines an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals to control a drive timing of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies the internal clock signal to the above various circuits.

In the CPU which is one of semiconductor devices of the present invention, the integrated circuit can be formed using a single crystal semiconductor layer (SOI layer) which is bonded to a substrate having an insulating surface or an insulating substrate; therefore, not only faster processing speed but also lower power consumption can be achieved. Further, in the present invention, productivity can be increased while a base substrate is increased in size, so that the cost for each CPU can be reduced.

This embodiment can be implemented in combination with any of the above embodiment modes and embodiments as appropriate.

[Embodiment 4]

This embodiment will describe a structure of an active matrix semiconductor display device, which is one of semiconductor devices manufactured by the present invention.

An active matrix light-emitting device has pixels each provided with a light-emitting element corresponding to a display element. Since a light-emitting element emits light by itself, there are advantages in that the visibility is high, a backlight necessary for a liquid crystal display device is not needed, which is suitable for thinning, and moreover the viewing angle is not restricted. Although this embodiment describes a light-emitting device using an organic light-emitting diode (an OLED) as one of light-emitting elements, the semiconductor display device manufactured by the present invention may be a light-emitting device using any other light-emitting element.

An OLED includes an anode layer, a cathode layer, and a layer including a material from which luminescence (electroluminescence) can be obtained by applying an electric field. As electroluminescence, there are luminescence (fluorescence) at the time of returning from a singlet-excited state to a ground state and luminescence (phosphorescence) at the time of returning from a triplet-excited state to a ground state. In a light-emitting device manufactured by the present invention, one of or both fluorescence and phosphorescence may be used.

Figure 18A:
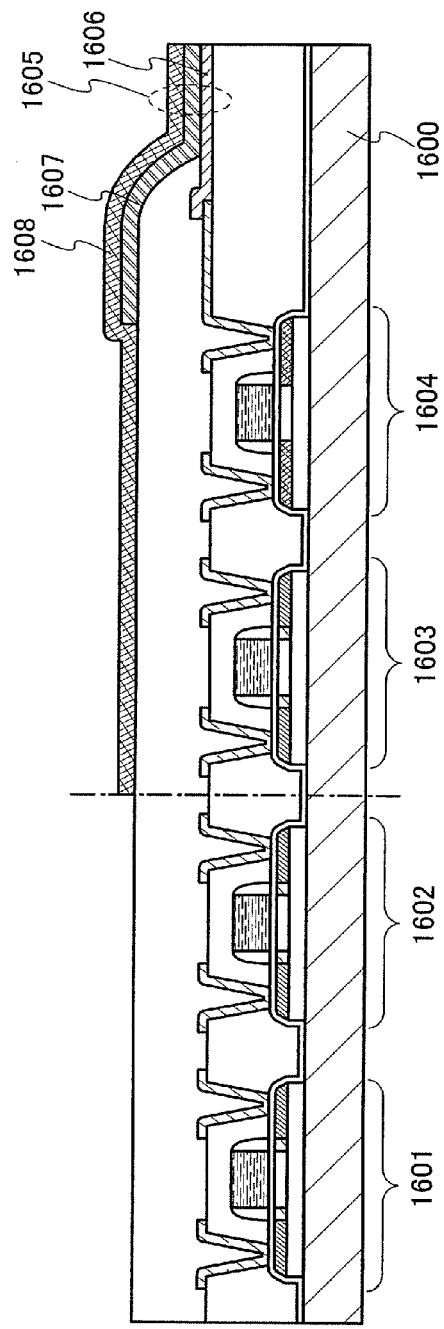
FIGS. 18A and 18B are views illustrating semiconductor devices each formed using a manufacturing method of the present invention.

FIG. 18A is a cross-sectional view of a light-emitting device of this embodiment. In the light-emitting device shown in FIG. 16A, a transistor 1601 and a transistor 1602 which are used for a driver circuit, a driver transistor 1604 which is used for a pixel, and a switching transistor 1603 are formed over an element substrate 1600. The light-emitting device shown in FIG. 18A has a light-emitting element 1605 in a pixel over the element substrate 1600.

The light-emitting element 1605 has a pixel electrode 1606, an electroluminescent layer 1607, and a counter electrode 1608. One of the pixel electrode 1606 and the counter electrode 1608 is an anode, and the other is a cathode.

The anode can be formed of a light-transmitting conductive oxide such as indium tin oxide containing silicon oxide (ITSO), indium tin oxide (ITO), zinc oxide (ZnO), indium zinc oxide (IZO), or gallium-doped zinc oxide (GZO). As an alternative to the light-transmitting conductive oxide, the anode can be formed, for example, as a single-layer film including one or more of titanium nitride, zirconium nitride, Ti, W, Ni, Pt, Cr, Ag, Al, and the like, as a stack of a titanium nitride film and a film containing aluminum as its main component, as a three-layer film of a titanium nitride film, a film containing aluminum as its main component, and a titanium nitride film, or the like. In the case where the anode is formed of a material other than the light-transmitting conductive oxide and light is extracted from the anode side, the anode is formed to a thickness such that light transmits therethrough (preferably approximately 5 nm to 30 nm).

It is to be noted that the anode can be formed of a conductive composition including a conductive macromolecule (also referred to as a conductive polymer). The conductive composition preferably has a sheet resistance of 10000 Ω/□ or less and a light transmittance of 70% or more at a wavelength of 550 nm when the conductive composition is formed into a conductive film serving as an anode. Moreover, the conductive macromolecule included in the conductive composition preferably has a resistivity of 0.1 Ω·cm or less.

The conductive macromolecule may be a so-called π-electron conjugated conductive macromolecule. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

As specific examples of a conjugated conductive polymer, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The aforementioned conductive macromolecule may be used alone as the conductive composition for the anode. Alternatively, in order to adjust the film characteristics such as the uniformity of the film thickness of the conductive composition and the film strength thereof, an organic resin may be added to the aforementioned conductive macromolecule.

As the organic resin, a thermosetting resin, a thermoplastic resin, or a photocurable resin may be used as long as the resin is compatible to a conductive macromolecule or the resin can be mixed and dispersed into a conductive macromolecule. For example, a polyester-based resin such as polyethylene terephthalate, polybutylene terephthalate, or polyethylene naphthalate; a polyimide-based resin such as polyimide or polyamide-imide; a polyamide resin such as polyamide 6, polyamide 66, polyamide 12, or polyamide 11; a fluorine resin such as polyvinylidene fluoride, polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins can be used.

Further, in order to adjust the electrical conductivity of the conductive composition, the conductive composition may be doped with an acceptor dopant or a donor dopant to change the oxidation-reduction potential of a conjugated electron in the conjugated conductive macromolecule.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound having plural cyano groups in a conjugated bonding, for example, tetracyanoethylene, tetracyanoethylene oxide, tetracyanobenzene, tetracyanoquinodimethane, tetracyanoazanaphthalene, and the like are given.

As the donor dopant, there are an alkali metal, an alkaline-earth metal, a quaternary amine compound, and the like.

Alternatively, a conductive composition is dissolved in water or an organic solvent (e.g., an alcohol-based solvent, a ketone-based solvent, an ester-based solvent, a hydrocarbon-based solvent, or an aromatic-based solvent) and a wet process is used, thereby a thin film which serves as the anode can be formed.

There is no particular limitation on the solvent in which the conductive composition is dissolved as long as the above-described conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and the like.

After the conductive composition is dissolved in the solvent as described above, a film thereof can be formed by a wet process such as a coating method, a droplet discharging method (also referred to as an inkjet method), or a printing method. The solvent may be dried by heat treatment or may be dried under reduced pressure. In the case where the organic resin is a thermosetting resin, heat treatment may be performed further. In the case where the organic resin is a photocurable resin, light irradiation treatment may be performed.

The cathode can be formed in general by using a metal, an alloy, an electrically conductive compound, or a mixture thereof, each of which has a low work function. Specifically, a rare-earth metal such as Yb or Er as well as an alkali metal such as Li or Cs, an alkaline-earth metal such as Mg, Ca, or Sr, or an alloy containing these (Mg:Ag, Al:Li, or the like) can be used. When a layer containing a material having a high electron-injecting property is formed in contact with the cathode, a general conductive film of aluminum, a light-transmitting conductive oxide material, or the like can be used.

The electroluminescent layer 1607 may be formed as a single layer or a stack of plural layers, each layer of which may include an inorganic material in addition to the organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in this order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in this order.

The electroluminescent layer 1607 can be formed by a droplet discharging method using any of a macromolecular organic compound, an intermolecular organic compound (which does not have a subliming property but has a molecular chain length of 10 μm or less), a low molecular organic compound, or an inorganic compound. In the case of using an intermolecular organic compound, a low molecular organic compound, or an inorganic compound, the electroluminescent layer 1607 may be formed by an evaporation method.

Note that the switching transistor 1603 and the driver transistor 1604 may each have a multigate structure such as a double gate structure or a triplet gate structure instead of a single gate structure.

Figure 18B:
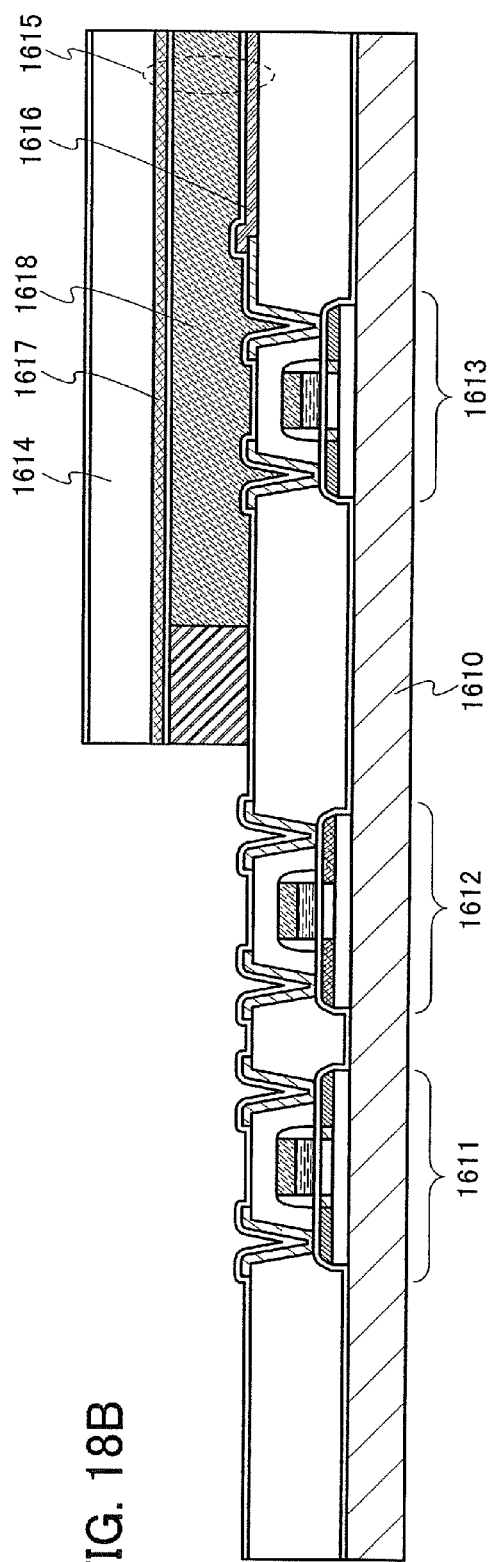

Next, FIG. 18B is a cross-sectional view of a liquid crystal display device of this embodiment. In the liquid crystal display device shown in FIG. 18B, a transistor 1611 and a transistor 1612 which are used for a driver circuit, and a transistor 1613 which is used as a switching element in a pixel are formed over an element substrate 1610. The liquid crystal display device shown in FIG. 18B has a liquid crystal cell 1615 between the element substrate 1610 and a counter substrate 1614.

The liquid crystal cell 1615 has a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed of, for example, indium tin oxide including silicon oxide (ITSO), indium tin oxide (ITO), zinc oxide (ZnO), indium zinc oxide (IZO), gallium-doped zinc oxide (GZO), or the like.

This embodiment mode can be implemented in combination with any of the above embodiment modes and embodiments as appropriate.

[Embodiment 5]

Figure 19A:
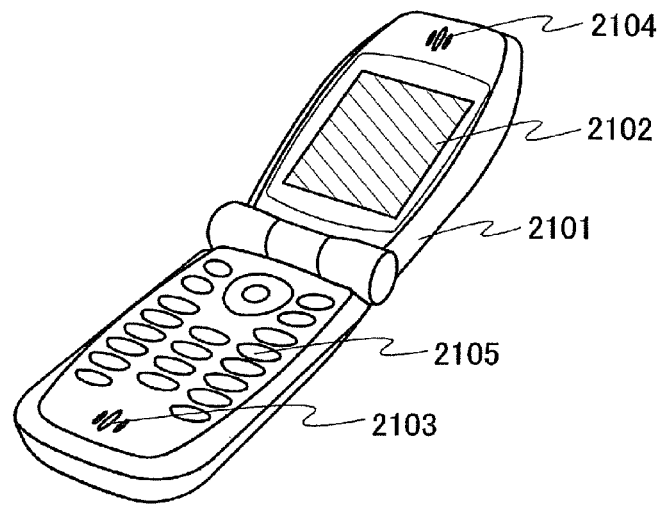
FIGS. 19A to 19C are views of electronic appliances each using a semiconductor device formed using a manufacturing method of the present invention.
Figure 19B:
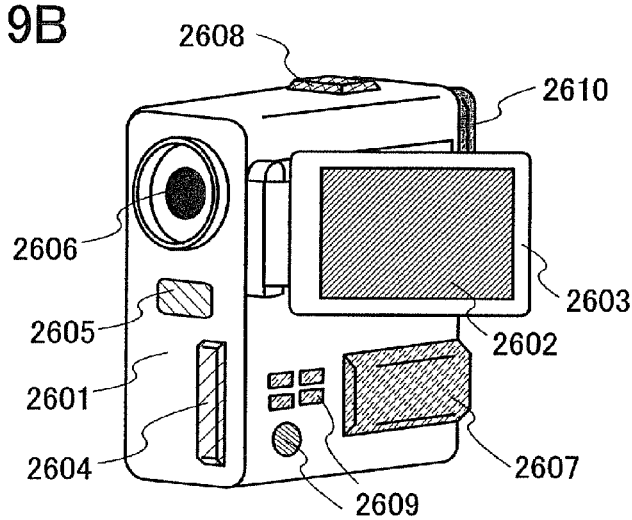
Figure 19C:
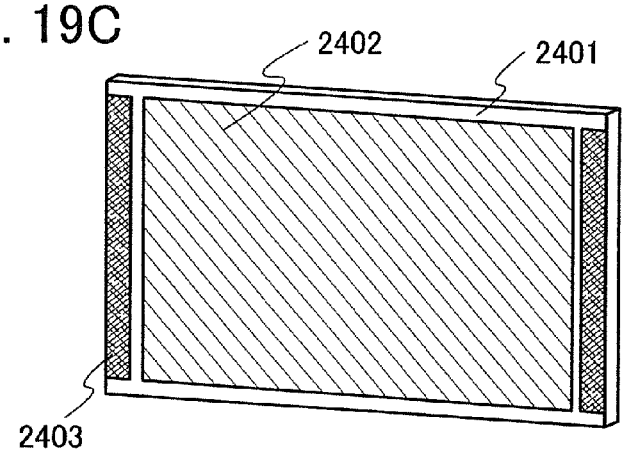

Electronic appliances using the semiconductor device of the present invention include cellular phones, portable game consoles or electronic books, cameras such as video cameras and digital still cameras, goggle displays (head mounted displays), navigation systems, audio reproducing devices (such as car audios and audio components), laptop personal computers, image reproducing devices each provided with a recording medium (specifically, a device for reproducing a content of a recording medium such as a digital versatile disc (DVD) and having a display for displaying the reproduced image) and the like. FIGS. 19A to 19C show specific examples of these electronic appliances.

FIG. 19A shows a cellular phone, which includes a main body 2101, a display portion 2102, an audio input portion 2103, an audio output portion 2104, and operation keys 2105. By using a display device formed by the manufacturing method of the invention for the display portion 2102 or a signal processing circuit, a cellular phone can be provided at low cost.

FIG. 19B is a video camera which includes a main body 2601, a display portion 2602, a housing 2603, an external connections port 2604, a remote controller receiver 2605, an image receiving portion 2606, a battery 2607, an audio input portion 2608, an operation key 2609, an eye piece portion 2610, or the like. By using a display device formed by the manufacturing method of the present invention for the display portion 2602 or a signal processing circuit, a video camera can be provided at low cost.

FIG. 19C is an image display device which includes a housing 2401, a display portion 2402, a speaker portion 2403, or the like. By using a display device formed by the manufacturing method of the invention for the display portion 2402 or a signal processing circuit, an image display device can be provided at low cost. Note that the image display device may be any image display device for a personal computer, for TV broadcast reception, for advertisement display, or the like.

As described above, the application range of the present invention is so wide that the present invention can be applied to electronic appliances of various fields.

This embodiment can be implemented in combination with any of the above embodiment modes and embodiments as appropriate.

This application is based on Japanese Patent Application serial no. 2007-244624 filed with Japan Patent Office on Sep. 21, 2007, the entire contents of which are hereby incorporated by reference.

What is claimed is:

1. A method for manufacturing a semiconductor substrate, comprising:
arranging a plurality of single crystal semiconductor substrates on a tray;
placing a base substrate over the tray provided with the plurality of single crystal semiconductor substrates;
bonding the plurality of single crystal semiconductor substrates to the base substrate while the plurality of single crystal semiconductor substrates are arranged in the tray;
separating the plurality of single crystal semiconductor substrates to form a plurality of single crystal semiconductor layers over the base substrate;
thinning the plurality of single crystal semiconductor layers by etching; and
irradiating the plurality of single crystal semiconductor layers with a laser beam,
wherein the tray has a plurality of depressions for holding the plurality of single crystal semiconductor substrates, and
wherein each of the plurality of depressions in the tray has a size which is within a region to be exposed to light of one shot of a reduced-projection light exposure apparatus.

2. A method for manufacturing a semiconductor substrate according to claim 1, further comprising:
forming an insulating film over the plurality of single crystal semiconductor substrates while the plurality of single crystal semiconductor substrates are arranged in the tray.

3. A method for manufacturing a semiconductor substrate according to claim 1, further comprising:
performing ion irradiation on the plurality of single crystal semiconductor substrates to form a damaged region in the plurality of single crystal semiconductor substrates while the plurality of single crystal semiconductor substrates are arranged in the tray.

4. A method for manufacturing a semiconductor substrate according to claim 1, wherein the step of thinning the plurality of single crystal semiconductor layers is performed before the step of irradiating the plurality of single crystal semiconductor layers.

5. A method for manufacturing a semiconductor substrate according to claim 1, wherein the step of thinning the plurality of single crystal semiconductor layers is performed after the step of irradiating the plurality of single crystal semiconductor layers.

6. A method for manufacturing a semiconductor substrate according to claim 1, further comprising:
forming an insulating film including nitrogen over the plurality of single crystal semiconductor substrates while the plurality of single crystal semiconductor substrates are arranged in the tray.

7. A method for manufacturing a semiconductor substrate according to claim 1, further comprising:
forming an oxide insulating film over the plurality of single crystal semiconductor substrates by performing a thermal oxidation treatment while the plurality of single crystal semiconductor substrates are arranged in the tray.

8. A method for manufacturing a semiconductor substrate according to claim 1, wherein a size of the tray is the same as a size of the base substrate.

9. A method for manufacturing a semiconductor substrate, comprising:
forming an insulating film over a plurality of single crystal semiconductor substrates while the plurality of single crystal semiconductor substrates are arranged in a first tray;
moving the plurality of single crystal semiconductor substrates from the first tray to a second tray;
placing a base substrate over the second tray provided with the plurality of single crystal semiconductor substrates;
bonding the plurality of single crystal semiconductor substrates to the base substrate so that the insulating film is interposed between the plurality of single crystal semiconductor substrates and the base substrate while the plurality of single crystal semiconductor substrates are arranged in the second tray;
separating the plurality of single crystal semiconductor substrates to form a plurality of single crystal semiconductor layers over the base substrate;
thinning the plurality of single crystal semiconductor layers by etching; and
irradiating the plurality of single crystal semiconductor layers with a laser beam,
wherein the first tray and the second tray have a plurality of depressions for holding the plurality of single crystal semiconductor substrates, and wherein each of the plurality of depressions in the first and the second tray has a size which is within a region to be exposed to light of one shot of a reduced-projection light exposure apparatus.

10. A method for manufacturing a semiconductor substrate according to claim 9, wherein the step of thinning the plurality of single crystal semiconductor layers is performed before the step of irradiating the plurality of single crystal semiconductor layers.

11. A method for manufacturing a semiconductor substrate according to claim 9, wherein the step of thinning the plurality of single crystal semiconductor layers is performed after the step of irradiating the plurality of single crystal semiconductor layers.

12. A method for manufacturing a semiconductor substrate according to claim 9, wherein the insulating film includes nitrogen.

13. A method for manufacturing a semiconductor substrate according to claim 9, wherein the insulating film is formed by thermal oxidation treatment of the plurality of single crystal semiconductor substrates.

14. A method for manufacturing a semiconductor substrate according to claim 9, wherein a size of the second tray is the same as a size of the base substrate.

15. A method for manufacturing a semiconductor substrate, comprising:
    performing ion irradiation on a plurality of single crystal semiconductor substrates to form a damaged region in the plurality of single crystal semiconductor substrates while the plurality of single crystal semiconductor substrates are arranged in a first tray;
    moving the plurality of single crystal semiconductor substrates from the first tray to a second tray;
    placing a base substrate over the second tray provided with the plurality of single crystal semiconductor substrates;
    bonding the plurality of single crystal semiconductor substrates to the base substrate while the plurality of single crystal semiconductor substrates are arranged in the second tray;
    separating the plurality of single crystal semiconductor substrates at the damaged region to form a plurality of single crystal semiconductor layers over the base substrate;
    thinning the plurality of single crystal semiconductor layers by etching; and
    irradiating the plurality of single crystal semiconductor layers with a laser beam,
    wherein the first tray and the second tray have a plurality of depressions for holding the plurality of single crystal semiconductor substrates, and
    wherein each of the plurality of depressions in the first and the second tray has a size which is within a region to be exposed to light of one shot of a reduced-projection light exposure apparatus.

16. A method for manufacturing a semiconductor substrate according to claim 15, wherein the step of thinning the plurality of single crystal semiconductor layers is performed before the step of irradiating the plurality of single crystal semiconductor layers.

17. A method for manufacturing a semiconductor substrate according to claim 15, wherein the step of thinning the plurality of single crystal semiconductor layers is performed after the step of irradiating the plurality of single crystal semiconductor layers.

18. A method for manufacturing a semiconductor substrate according to claim 15, further comprising:
    forming an insulating film including nitrogen over the plurality of single crystal semiconductor substrates while the plurality of single crystal semiconductor substrates are arranged in the first tray.

19. A method for manufacturing a semiconductor substrate according to claim 15, further comprising:
    forming an oxide insulating film over the plurality of single crystal semiconductor substrates by performing a thermal oxidation treatment while the plurality of single crystal semiconductor substrates are arranged in the first tray.

20. A method for manufacturing a semiconductor substrate according to claim 15, wherein a size of the second tray is the same as a size of the base substrate.

21. A method for manufacturing a semiconductor device, comprising:
    arranging a plurality of single crystal semiconductor substrates on a tray;
    placing a base substrate over the tray provided with the plurality of single crystal semiconductor substrates;
    bonding the plurality of single crystal semiconductor substrates to the base substrate while the plurality of single crystal semiconductor substrates are arranged in the tray;
    separating the plurality of single crystal semiconductor substrates to form a plurality of single crystal semiconductor layers over the base substrate;
    thinning the plurality of single crystal semiconductor layers by etching;
    irradiating the plurality of single crystal semiconductor layers with a laser beam; and
    forming a semiconductor element by use of the plurality of single crystal semiconductor layers which are thinned,
    wherein the tray has a plurality of depressions for holding the plurality of single crystal semiconductor substrates, and
    wherein each of the plurality of depressions in the tray has a size which is within a region to be exposed to light of one shot of a reduced-projection light exposure apparatus.

22. A method for manufacturing a semiconductor device according to claim 21, further comprising:
    forming an insulating film over the plurality of single crystal semiconductor substrates while the plurality of single crystal semiconductor substrates are arranged in the tray.

23. A method for manufacturing a semiconductor device according to claim 21, further comprising:
    performing ion irradiation on the plurality of single crystal semiconductor substrates to form a damaged region in the plurality of single crystal semiconductor substrates while the plurality of single crystal semiconductor substrates are arranged in the tray.

24. A method for manufacturing a semiconductor device according to claim 21, wherein the step of thinning the plurality of single crystal semiconductor layers is performed before the step of irradiating the plurality of single crystal semiconductor layers.

25. A method for manufacturing a semiconductor device according to claim 21, wherein the step of thinning the plurality of single crystal semiconductor layers is performed after the step of irradiating the plurality of single crystal semiconductor layers.

26. A method for manufacturing a semiconductor device according to claim 21, further comprising:

forming an insulating film including nitrogen over the plurality of single crystal semiconductor substrates while the plurality of single crystal semiconductor substrates are arranged in the tray.

27. A method for manufacturing a semiconductor device according to claim 21, further comprising:
forming an oxide insulating film over the plurality of single crystal semiconductor substrates by performing a thermal oxidation treatment while the plurality of single crystal semiconductor substrates are arranged in the tray.

28. A method for manufacturing a semiconductor device according to claim 21, wherein a size of the tray is the same as a size of the base substrate.

29. A method for manufacturing a semiconductor device, comprising:
forming an insulating film over a plurality of single crystal semiconductor substrates while the plurality of single crystal semiconductor substrates are arranged in a first tray;
moving the plurality of single crystal semiconductor substrates from the first tray to a second tray;
placing a base substrate over the second tray provided with the plurality of single crystal semiconductor substrates;
bonding the plurality of single crystal semiconductor substrates to the base substrate so that the insulating film is interposed between the plurality of single crystal semiconductor substrates and the base substrate while the plurality of single crystal semiconductor substrates are arranged in the second tray;
separating the plurality of single crystal semiconductor substrates to form a plurality of single crystal semiconductor layers over the base substrate;
thinning the plurality of single crystal semiconductor layers by etching;
irradiating the plurality of single crystal semiconductor layers with a laser beam; and
forming a semiconductor element by use of the plurality of single crystal semiconductor layers which are thinned,
wherein the first tray and the second tray have a plurality of depressions for holding the plurality of single crystal semiconductor substrates, and
wherein each of the plurality of depressions in the first and the second tray has a size which is within a region to be exposed to light of one shot of a reduced-projection light exposure apparatus.

30. A method for manufacturing a semiconductor device according to claim 29, wherein the step of thinning the plurality of single crystal semiconductor layers is performed before the step of irradiating the plurality of single crystal semiconductor layers.

31. A method for manufacturing a semiconductor device according to claim 29, wherein the step of thinning the plurality of single crystal semiconductor layers is performed after the step of irradiating the plurality of single crystal semiconductor layers.

32. A method for manufacturing a semiconductor device according to claim 29, wherein the insulating film includes nitrogen.

33. A method for manufacturing a semiconductor device according to claim 29, wherein the insulating film is formed by thermal oxidation treatment of the plurality of single crystal semiconductor substrates.

34. A method for manufacturing a semiconductor device according to claim 29, wherein a size of the second tray is the same as a size of the base substrate.

35. A method for manufacturing a semiconductor device, comprising:
performing ion irradiation on a plurality of single crystal semiconductor substrates to form a damaged region in the plurality of single crystal semiconductor substrates while the plurality of single crystal semiconductor substrates are arranged in a first tray;
moving the plurality of single crystal semiconductor substrates from the first tray to a second tray;
placing a base substrate over the second tray provided with the plurality of single crystal semiconductor substrates;
bonding the plurality of single crystal semiconductor substrates to the base substrate while the plurality of single crystal semiconductor substrates are arranged in the second tray;
separating the plurality of single crystal semiconductor substrates at the damaged region to form a plurality of single crystal semiconductor layers over the base substrate;
thinning the plurality of single crystal semiconductor layers by etching;
irradiating the plurality of single crystal semiconductor layers with a laser beam; and
forming a semiconductor element by use of the plurality of single crystal semiconductor layers which are thinned,
wherein the first tray and the second tray have a plurality of depressions for holding the plurality of single crystal semiconductor substrates, and
wherein each of the plurality of depressions in the first and the second tray has a size which is within a region to be exposed to light of one shot of a reduced-projection light exposure apparatus.

36. A method for manufacturing a semiconductor device according to claim 35, wherein the step of thinning the plurality of single crystal semiconductor layers is performed before the step of irradiating the plurality of single crystal semiconductor layers.

37. A method for manufacturing a semiconductor device according to claim 35, wherein the step of thinning the plurality of single crystal semiconductor layers is performed after the step of irradiating the plurality of single crystal semiconductor layers.

38. A method for manufacturing a semiconductor device according to claim 35, further comprising:
forming an insulating film including nitrogen over the plurality of single crystal semiconductor substrates while the plurality of single crystal semiconductor substrates are arranged in the first tray.

39. A method for manufacturing a semiconductor device according to claim 35, further comprising:
forming an oxide insulating film over the plurality of single crystal semiconductor substrates by performing a thermal oxidation treatment while the plurality of single crystal semiconductor substrates are arranged in the first tray.

40. A method for manufacturing a semiconductor device according to claim 35, wherein a size of the second tray is the same as a size of the base substrate.

* * * * *